(12) United States Patent
Kim et al.

(10) Patent No.: US 10,872,570 B2
(45) Date of Patent: Dec. 22, 2020

(54) ELECTROLUMINESCENT DISPLAY DEVICE FOR MINIMIZING A VOLTAGE DROP AND IMPROVING IMAGE QUALITY AND DRIVING METHOD THEREOF

(71) Applicant: LG DISPLAY CO., LTD., Seoul (KR)

(72) Inventors: Jaesung Kim, Paju-si (KR); Juhnsuk Yoo, Daegu (KR); Jungchul Kim, Daegu (KR); Chungsik Kong, Daegu (KR); Mihee Shin, Daegu (KR); Honggyu Han, Daegu (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/002,630

(22) Filed: Jun. 7, 2018

(65) Prior Publication Data

US 2019/0066598 A1    Feb. 28, 2019

(30) Foreign Application Priority Data

Aug. 31, 2017  (KR) .......... 10-2017-0111225
Oct. 19, 2017  (KR) .......... 10-2017-0135720

(51) Int. Cl.
*G09G 3/3266*    (2016.01)
*G09G 3/3258*    (2016.01)
(Continued)

(52) U.S. Cl.
CPC ......... *G09G 3/3266* (2013.01); *G09G 3/3233* (2013.01); *G09G 3/3258* (2013.01); *G09G 3/3291* (2013.01); *H01L 27/3265* (2013.01); *H01L 27/3276* (2013.01); *H01L 51/5206* (2013.01); *H01L 51/5221* (2013.01); *G09G 2300/0819* (2013.01); *G09G 2300/0842* (2013.01); *G09G 2300/0861* (2013.01); *G09G 2300/0876* (2013.01);
(Continued)

(58) Field of Classification Search
CPC .. G09G 3/3266; G09G 3/3258; G09G 3/3291; G09G 3/3233; G09G 2330/025; G09G 2300/0819; G09G 2300/0842; G09G 2300/0861; G09G 2300/0876; G09G 2310/0251; G09G 2310/06; G09G 2320/0233; G09G 2320/045
See application file for complete search history.

(56) References Cited

U.S. PATENT DOCUMENTS

2013/0140537 A1*  6/2013  Ha .................. H01L 27/3262
                                          257/40
2013/0328753 A1   12/2013  Tsuge
(Continued)

FOREIGN PATENT DOCUMENTS

KR   10-2014-0050197 A    4/2014
KR   10-2014-0050361 A    4/2014
KR   10-2016-0113464 A    9/2016

*Primary Examiner* — Kwang-Su Yang
(74) *Attorney, Agent, or Firm* — Birch, Stewart, Kolasch & Birch, LLP

(57) ABSTRACT

There is provided an electroluminescence display device comprising a display panel having a display area where images are displayed and a non-display area where images are not displayed, a subpixel located in the display area, and a voltage transfer part that is located in the non-display area and transfers a reference voltage to the subpixel in response to a signal applied from outside the display panel or a signal generated on the display panel.

16 Claims, 31 Drawing Sheets

(51) Int. Cl.
*G09G 3/3291* (2016.01)
*H01L 27/32* (2006.01)
*H01L 51/52* (2006.01)
*G09G 3/3233* (2016.01)

(52) U.S. Cl.
CPC . *G09G 2310/0251* (2013.01); *G09G 2310/06* (2013.01); *G09G 2320/0233* (2013.01); *G09G 2320/045* (2013.01); *G09G 2330/025* (2013.01)

(56) References Cited

U.S. PATENT DOCUMENTS

| | | | |
|---|---|---|---|
| 2014/0111503 A1* | 4/2014 | Kwon | G09G 3/3233 345/213 |
| 2014/0111563 A1 | 4/2014 | Hwang et al. | |
| 2016/0064421 A1* | 3/2016 | Oh | H01L 27/1222 257/43 |
| 2016/0104423 A1* | 4/2016 | Park | G09G 3/3233 345/78 |
| 2016/0104430 A1 | 4/2016 | Park | |
| 2016/0275869 A1 | 9/2016 | Hwang et al. | |
| 2016/0307504 A1* | 10/2016 | Hung | G09G 3/3233 |
| 2017/0213506 A1 | 7/2017 | Shibusawa et al. | |
| 2018/0350306 A1* | 12/2018 | Zhang | G09G 3/3266 |

\* cited by examiner

ELECTROLUMINESCENT DISPLAY DEVICE FOR MINIMIZING A VOLTAGE DROP AND IMPROVING IMAGE QUALITY AND DRIVING METHOD THEREOF

This application claims the priority benefit of Korean Patent Application No. 10-2017-0111225, filed on Aug. 31, 2017, and No. 10-2017-0135720, filed on Oct. 19, 2017, the entire contents of all these applications are incorporated herein by reference for all purposes as if fully set forth herein.

BACKGROUND

Field

The present disclosure relates to an electroluminescence display and a driving method thereof.

Related Art

The market for displays which act as an intermediary between users and information is growing with the development of information technology. Thus, different types of display devices such as electroluminescence displays, liquid crystal displays, and quantum dot displays are increasingly used.

A display device comprises a display panel comprising a plurality of subpixels and a driving unit that drives the display panel. The driving unit comprises a gate driver that supplies gate signals to the display panel and a data driver that supplies data signals to the display panel.

In the case of an electroluminescence display, for example, when gate signals, data signals, etc. are supplied to the subpixels, the light-emitting elements of selected subpixels emit light to thereby display an image. The light-emitting elements may be implemented based on organic or inorganic materials.

The electroluminescence display has many advantages because it displays an image based on light generated by the light-emitting elements in the subpixels, so there is a need for improvements in the accuracy of pixel circuits that control the light emission of the subpixels. For example, the accuracy of the pixel circuits may be improved by compensating for time-varying characteristics (or variation with time), such as the threshold voltage of the transistors included in the pixel circuits.

The time-varying characteristics of the electroluminescence display can be compensated for in various ways. However, some of the commonly proposed compensation methods do not take drops in the voltage applied to the subpixels into consideration, which result in picture quality issues such as vertical luminance non-uniformity or crosstalk on the display panel.

Therefore, attempts are being made to seek solutions for improving the accuracy of the pixel circuits and gate driver in order to transfer accurate signals to the subpixels.

SUMMARY

The inventors of the present specification recognized the aforementioned problems and devised a display panel for minimizing voltage drops on voltage-supply lines and invented a display device using the same.

An aspect of the present disclosure is to provide a pixel circuit electroluminescence display that can solve/address picture quality issues such as vertical luminance non-uniformity or crosstalk on the display panel by compensating for time-varying characteristics, with voltage drops on voltage supply lines taken into consideration, and an electroluminescence display comprising the same.

Another aspect of the present disclosure is to provide an electroluminescence display that can achieve a high resolution by efficiently designing a gate driver providing gate signals applied to subpixels and a circuit providing a reference voltage.

Another aspect of the present disclosure is to provide an electroluminescence display is to provide a driving method of an electroluminescence display that includes the step of providing a reference voltage according to a method of driving subpixels so as to eliminate or minimize the effect of voltage drops on a drive current applied to organic light-emitting elements.

Technical problems to be solved or addressed by the present disclosure are not limited to the above-mentioned technical problems, and other technical problems not mentioned herein may be clearly understood by those skilled in the art from description below.

The objectives are solved by the features of the independent claims. Advantageous embodiments are derived from the respective dependent claims.

According to an aspect of the present disclosure, there is provided an electroluminescence display device comprising a display panel having a display area where images are displayed and a non-display area where images are not displayed, a subpixel located in the display area, and a voltage transfer part that is located in the non-display area and transfers a reference voltage to a voltage transfer node of the subpixel in response to a signal applied from outside the display panel or a signal generated on the display panel.

According to an aspect of the present disclosure, there is provided an electroluminescence display device comprising a display panel having a display area where images are displayed and a non-display area where images are not displayed, a subpixel located in the display area, and a voltage transfer part that is located in the non-display area and transfers a reference voltage to the subpixel. The method comprising an initial step for initializing the subpixel, and a sampling step for compensating for the threshold voltage of a driving transistor of the subpixel. Wherein, during the sampling step, the voltage transfer part operates in response to a signal applied from outside the display panel or a signal generated on the display panel.

According to an aspect of the present disclosure, there is provided an electroluminescence display device comprising a display panel having a display area where images are displayed and a non-display area where images are not displayed, a subpixel located in the display area, a gate driver located in the non-display area, and a voltage transfer transistor that is located in the non-display area and transfers a reference voltage to the subpixel. And a gate of the voltage transfer transistor is connected to the gate driver.

According to an aspect of the present disclosure, there is provided a driving method of an electroluminescence display device comprising a display panel having a display area and a non-display area, a subpixel located in the display area and comprising an organic light-emitting diode, and a voltage transfer part located in the non-display area. The method comprising a first initial step for initializing a gate of a driving transistor included in the subpixel, a sampling and second initial step for compensating for the threshold voltage of the driving transistor and initializing an anode of the organic light-emitting diode. Wherein, during the first initial step and the sampling and second initial step, the voltage transfer part provides a reference voltage to the subpixel.

Other detailed matters of the embodiments are included in the detailed description and the drawings.

According to the present disclosure, a circuit for transferring a reference voltage to subpixels may be included in a non-display area, and this can simplify the pixel circuits and therefore offers advantages for high integration, thereby preventing a decrease in aperture ratio when making a large-screen or high-resolution display panel.

According to the present disclosure, a circuit for transferring a reference voltage to subpixels may be included in the gate driver, and this can improve the efficiency of the gate driver.

According to the present disclosure, a drive circuit for compensating for time-varying characteristics (or variation with time) may be implemented, with drops in power-supply voltage taken into consideration, and this can solve picture quality problems such as vertical luminance non-uniformity or crosstalk on the display panel.

The objects to be achieved by the present disclosure, the aspects, and the effects of the present disclosure described above do not specify essential features of the claims, and, thus, the scope of the claims is not limited to the disclosure of the present disclosure.

BRIEF DESCRIPTION OF THE DRAWINGS

The accompany drawings, which are included to provide a further understanding of the disclosure and are incorporated on and constitute a part of this specification illustrate embodiments of the disclosure and together with the description serve to explain the principles of the disclosure.

DESCRIPTION OF EMBODIMENTS

Figure 1:
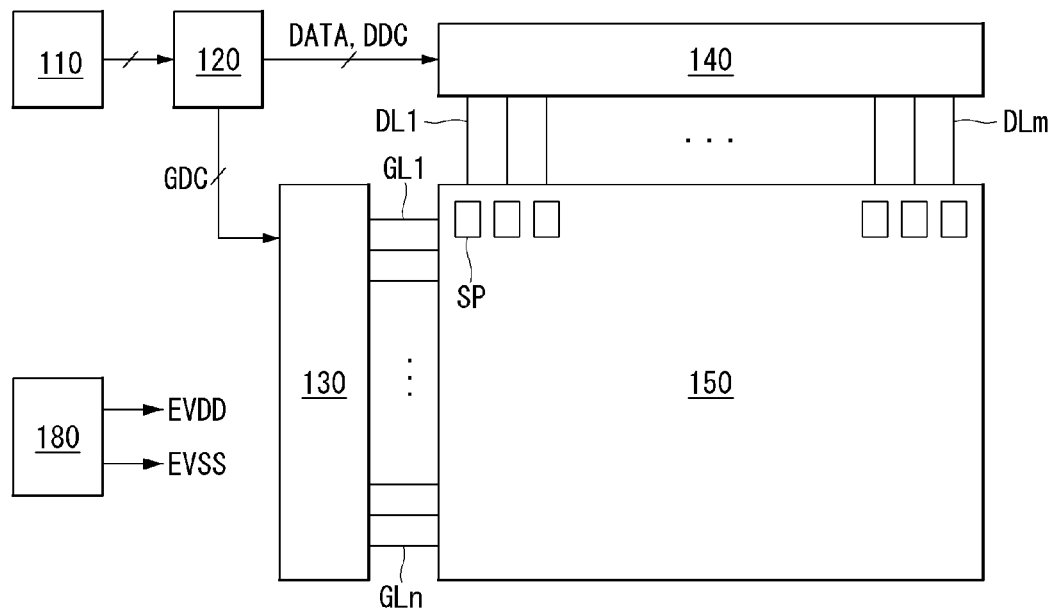
FIG. 1 is a schematic block diagram of an electroluminescence display according to an embodiment of the present disclosure.

Reference will now be made in detail embodiments of the disclosure of which are illustrated in the accompanying drawings.

Hereinafter, the embodiments of the present disclosure will be described with the attached drawings.

An electroluminescence display to be described below in this specification may be implemented as a television, a video player, a personal computer (PC), a home theater system, a smartphone, a virtual reality device (VR), and so on. The electroluminescence display below will be described by taking an organic electroluminescence display based on organic light-emitting diodes (light-emitting elements) as an example. Also, the electroluminescence display to be described in this specification may be implemented based on inorganic light-emitting diodes.

Moreover, the electroluminescence display to be described below in this specification may be implemented based on either a p-type transistor or n-type transistor or both of them. Source and drain are interchangeable between the p-type and n-type transistors, but a gate is not interchangeable. Hence, the source and drain may be termed first and second electrodes so as not to limit them to specific positions. Also, in the present specification, pixel circuits and a gate driver formed on a substrate of a display panel may be implemented as n-type or p-type transistors. For example, the transistors may be implemented as MOSFET (metal oxide semiconductor field effect transistor) transistors. A transistor is a three-electrode device with gate, source, and drain. The source is an electrode that provides carriers to the transistor. The carriers in the transistor flow from the source. The drain is an electrode where the carriers leave the transistor. That is, carriers in a transistor flow from the source to the drain. In the case of an n-type transistor, the carriers are electrons, and thus the source voltage is lower than the drain voltage so that the electrons flow from the source to the drain. In the n-type transistor, since the electrons flow from the source to the drain, current flows from the drain to the source. In the case of a p-type transistor, the carriers are holes, and thus the source voltage is higher than the drain voltage so that the holes flow from the source to the drain. In the p-type transistor, since the holes flow from the source to the drain, current flows from the source to the drain. It should be noted that the source and drain of a transistor are not fixed in position, but the source and drain of the transistor are interchangeable depending on the applied voltage.

As used herein, "gate-on voltage" may refer to the voltage of a gate signal at which a transistor can be turned on, and "gate-off voltage" may refer to the voltage of a gate signal at which a transistor may be turned off. In a p-type transistor, the gate-on voltage may be a gate-low voltage (or logic-low voltage VL), and the gate-off voltage may be a gate-high voltage (or logic-high voltage VH). In an n-type transistor, the gate-on voltage may be a gate-high voltage, and the gate-off voltage may be a gate-low voltage.

First Embodiment

Figure 2:
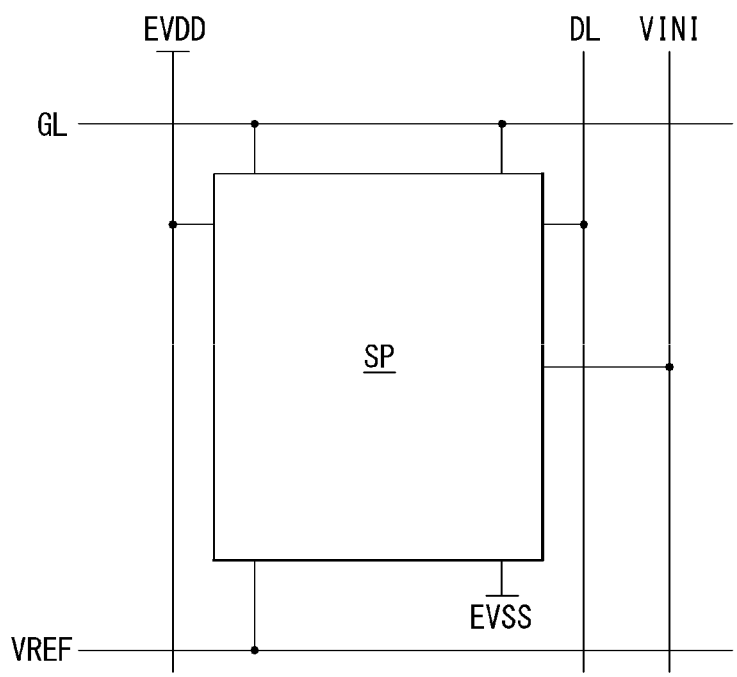
FIG. 2 is a schematic block diagram of a subpixel illustrated in FIG. 1.
Figure 3:
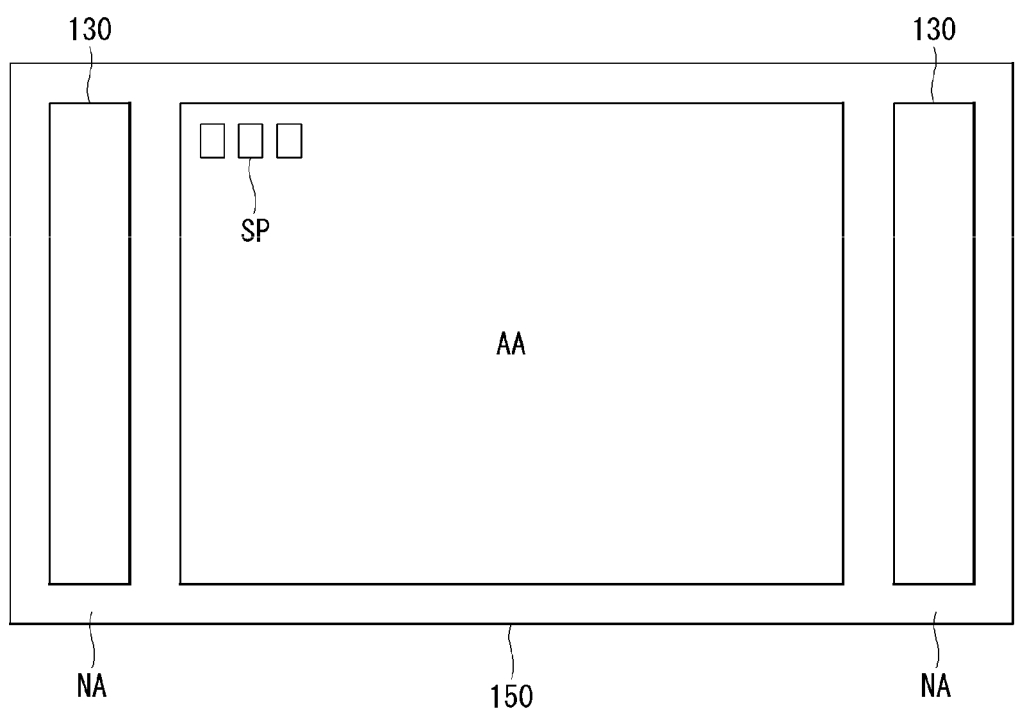
FIG. 3 is an illustration of the configuration of a gate driver illustrated in FIG. 1.

FIG. 1 is a schematic block diagram of an electroluminescence display according to an embodiment of the present disclosure. FIG. 2 is a schematic block diagram of a subpixel illustrated in FIG. 1. FIG. 3 is an illustration of the configuration of a gate driver illustrated in FIG. 1. All the components of the electroluminescence display (or display device) according to all embodiments of the present disclosure are operatively coupled and configured.

As illustrated in FIG. 1, the electroluminescence display comprises an image processor 110, a timing controller 120, a data driver 140, a scan driver 130, a display panel 150, and a power supply part 180.

The image processor 110 outputs drive signals for driving various kinds of devices, along with externally supplied image data. The drive signals outputted from the image processor 110 may comprise a data enable signal, a vertical synchronization signal, a horizontal synchronization signal, and a clock signal.

The timing controller 120 receives drive signals, etc., along with image data, from the image processor 110. The timing controller 120 outputs a gate timing control signal GDC for controlling the operation timing of the gate driver 130 and a data timing control signal DDC for controlling the operation timing of the data driver 140, based on the drive signals.

The data driver 140 outputs data voltages in response to a data timing control signal DDC supplied from the timing controller 120. The data driver 140 samples and latches a digital data signal DATA supplied from the timing controller 120 and converts it into an analog data voltage based on a gamma reference voltage. The data driver 140 outputs data voltages DATA through data lines DL1 to DLm where m is a positive integer. The data driver 140 may be provided in the form of an IC (integrated circuit).

The gate driver 130 outputs gate signals in response to a gate timing control signal GDC supplied from the timing controller 120. The gate driver 130 outputs gate signals through gate lines GL1 to GLn where n is a positive integer. The gate lines are also referred to herein as scan lines for supplying scan signals. The gate driver 130 may be provided in the form of an IC (integrated circuit). The gate driver 130 may be divided into a first gate driver and a second gate driver arranged at opposite sides of the display area AA.

The power supply part 180 outputs a first power supply voltage and a low-level voltage. The first power supply voltage and low-level voltage outputted from the power supply part 180 are supplied to the display panel 150. The first power supply voltage is supplied to the display panel 150 via a first power line EVDD, and the low-level voltage is supplied to the display panel 150 via a second power line EVSS. The voltages outputted from the power supply part 180 may be used by the data driver 140 or the gate driver 130.

The display panel 150 displays an image in response to data voltages and gate signals respectively supplied from the data driver 140 and gate driver 130 and power supplied from the power supply part 180. The display panel 150 comprises a plurality of subpixels SPs that work to display an image. Preferably, the subpixels SPs can be arranged in a matrix configuration.

The subpixels SPs may comprise red subpixels, green subpixels, and blue subpixels, or may comprise white subpixels, red subpixels, green subpixels, and blue subpixels. The subpixels SPs may have one or more different light-emission areas depending on the light-emission characteristics.

FIG. 2 is a block diagram of each subpixel SP of FIG. 1 and a signal inputted into the subpixel SP. Referring to FIG. 2, a single subpixel SP is connected to a gate line GL, a data line DL, a first power line EVDD, a second power line EVSS, an initial line VINI, and a reference voltage line VREF. The numbers of transistors and capacitors in the subpixel SP and the driving method thereof are determined by the configuration of the pixel. In this case, the gate line GL may comprise a plurality of gate lines that transfer gate signals. Accordingly, the gate driver may provide a single pixel circuit with one or more gate signals.

As illustrated in FIG. 3, the display panel 150 comprises a display area AA that displays an image based on subpixels SPs and a non-display area NA where signal lines or drive circuits are situated, that displays no image.

The gate driver 130 is provided in the form of a gate-in-panel in the non-display area NA of the display panel 150. The gate driver 130 may be placed on either one or both of the left and right sides of the display panel 150. The left side and the right side of the display panel 150 may be defined according to a horizontal alignment of the display panel 150. The left side is arranged opposite to the right side. The left side is a first side of the display panel 150 and the right side is a second side of the display panel 150 being arranged opposite to the first side. The gate driver 130 may include a plurality of stages. For example, the first stage of the gate driver 130 outputs a first gate signal (or a first scan signal) for driving a first gate line (or a first scan line) on the display panel 150.

Meanwhile, the electroluminescence display device has many advantages, including being spotlighted as a next-generation display device, because it displays an image based on light generated by the organic light-emitting diodes in the subpixels. However, the electroluminescence display has time-varying characteristics (variation with time), such as the threshold voltage of the elements (e.g., driving transistors, etc.) included in the subpixels, which need to be compensated for.

Consequently, various compensation methods for compensating for time-varying characteristics of the electroluminescence display have been suggested. However, some of these compensation methods do not take voltage drops into consideration and therefore have picture quality issues such as vertical luminance non-uniformity or crosstalk, thus bringing about the need for improvement.

Hereinafter, problems with a test example that bring about picture quality issues, such as vertical luminance non-uniformity or crosstalk on the display panel of the electroluminescence display, will be discussed, and an embodiment of the present specification for solving/addressing these problems will be described. For convenience of explanation, the following description will be given with an example in which all of the transistors included a subpixel are P-type transistors, but the embodiment of the present disclosure is also applicable to N-type transistors.

Test Example

Figure 4:
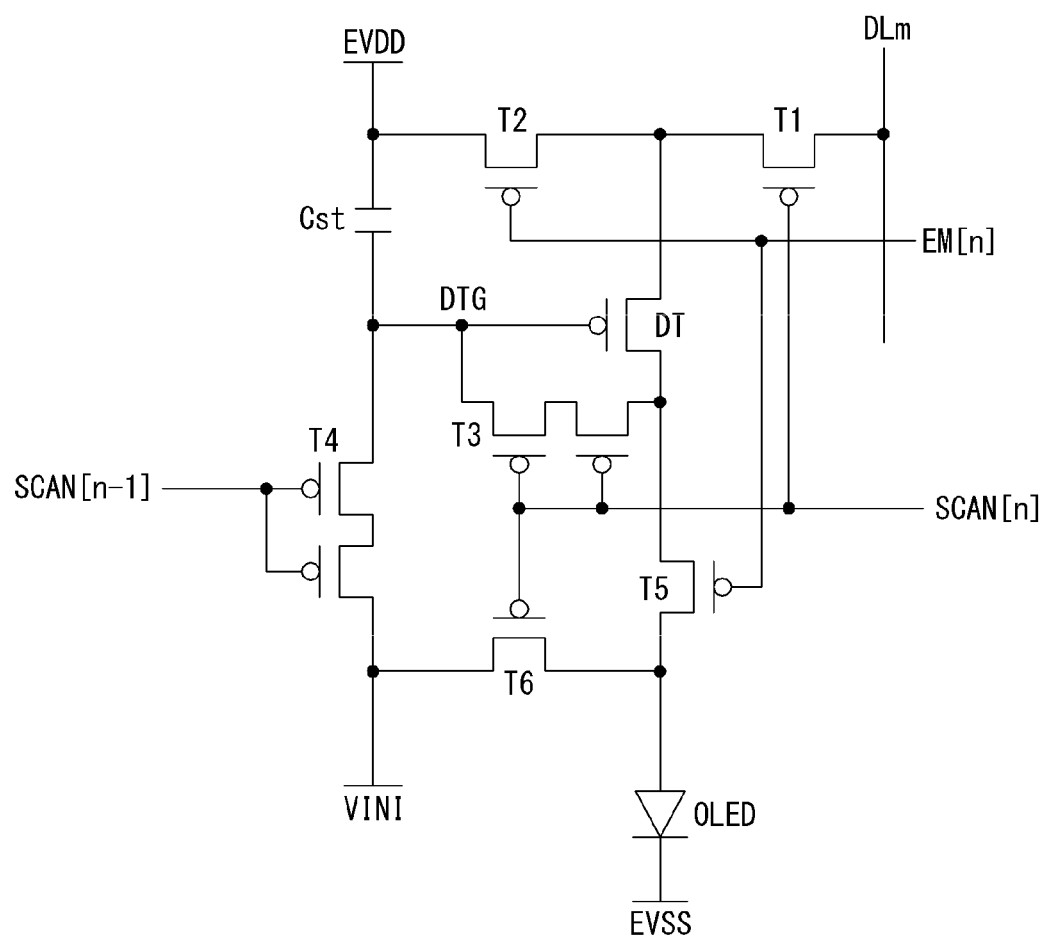
FIG. 4 is a circuit diagram of a subpixel which explains an electroluminescence display according to a test example.
Figure 5:
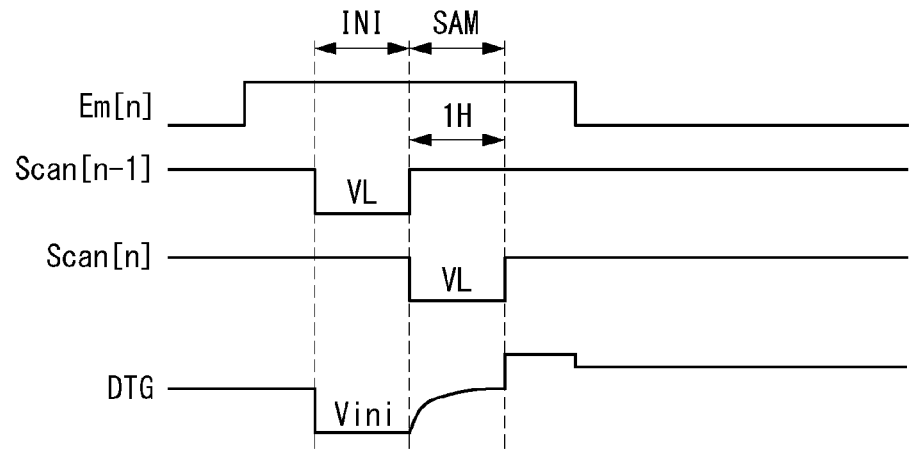
FIG. 5 is a waveform diagram explaining some of the drive characteristics of the subpixel circuit of FIG. 4.

FIG. 4 is a circuit diagram of a subpixel which explains an electroluminescence display according to a test example. FIG. 5 is a waveform diagram explaining some of the drive characteristics of the subpixel circuit of FIG. 4.

As illustrated in FIGS. 4 and 5, an nth subpixel according to the test example is a subpixel connected to an nth scan line and an mth data line, and the nth subpixel comprises first to sixth transistors T1 to T6, a driving transistor DT, a capacitor Cst, and an organic light-emitting diode OLED. Such a configuration of a subpixel circuit is referred to as 6T1C subpixel circuit.

The first to sixth transistors T1 to T6 and the driving transistor DT are configured as P-type transistors. The third transistor T3 and the fourth transistor T4 may be provided in the form of dual transistors (i.e., two transistors are connected in series, with gates connected together to form a pair). The third transistor T3 and the fourth transistor T4 may be single transistors.

For an nth subpixel according to a test example, internal circuit-based compensation is done as a first initial period INI and a sampling and second initial period SAM occur while an nth emission control signal Em[n] is not applied (the logic-high voltage is maintained). The operating characteristics during these periods will be described below in brief. The subpixels are arranged as a matrix and may be scanned row-by row.

During the first initial period INI, the fourth transistor T4 is turned on in response to the logic-low voltage of an (n−1)th scan signal Scan[n−1] applied via an (n−1)th scan line SCAN[n−1]. In this case, the initial voltage Vini, lower than the first power supply voltage applied via the first power supply line EVDD, is applied to the initial line VINI. By this operation, a gate node DTG of the driving transistor DT is initialized based on the initial voltage Vini.

During the sampling and second initial period SAM, the first transistor T1, third transistor T3, and sixth transistor T6 are turned on in response to the logic-low voltage VL of an nth scan signal Scan[n] applied via an nth scan line SCAN[n]. The nth scan line SCAN[n] is a scan line that transfers the nth scan signal Scan[n] for driving nth subpixels located in the nth scan line SCAN[n]. An (n−1)th scan line SCAN[n−1] is a scan line that transfers the (n−1)th scan signal Scan[n−1] for driving (n−1)th subpixels located in the row before the nth scan line SCAN[n].

A data voltage applied via the mth data line DLm is applied to a first electrode of the driving transistor DT by the turn-on of the first transistor T1. The driving transistor DT is diode-connected by the turn-on of the third transistor T3. The threshold voltage of the driving transistor DT is sampled by the turn-on of the third transistor T3. The data voltage applied to the first electrode of the driving transistor DT is stored in the gate node DTG via the third transistor T3. The organic light-emitting diode OLED is initialized based on the initial voltage Vini by the turn-on of the sixth transistor T6.

The concept of compensation in a subpixel according to the test example may be represented by the following current equation:

$$Ioled=K(Vsg-|Vth|)^2=K\{(VDD-(Vdata-|Vth|)-|Vth|\}^2=K(VDD-Vdata)^2$$

wherein Ioled is the current flowing through the organic light-emitting diode OLED, K is a constant, Vsg is the voltage between the source and gate of the driving transistor DT, Vth is the threshold voltage of the driving transistor DT, VDD is the first power supply voltage applied via the first power supply line EVDD, and Vdata is a data voltage applied via the mth data line DLm.

However, the subpixel SP according to the test example has defect issues caused by voltage drop (IR drop) in the first power supply voltage since the first power supply voltage applied via the first power supply line EVDD is not taken into consideration. Voltage drops in the first power supply voltage bring about picture quality issues such as vertical luminance uniformity or crosstalk on the display panel, so improvements can be made in the following embodiments.

First Embodiment

Figure 6:
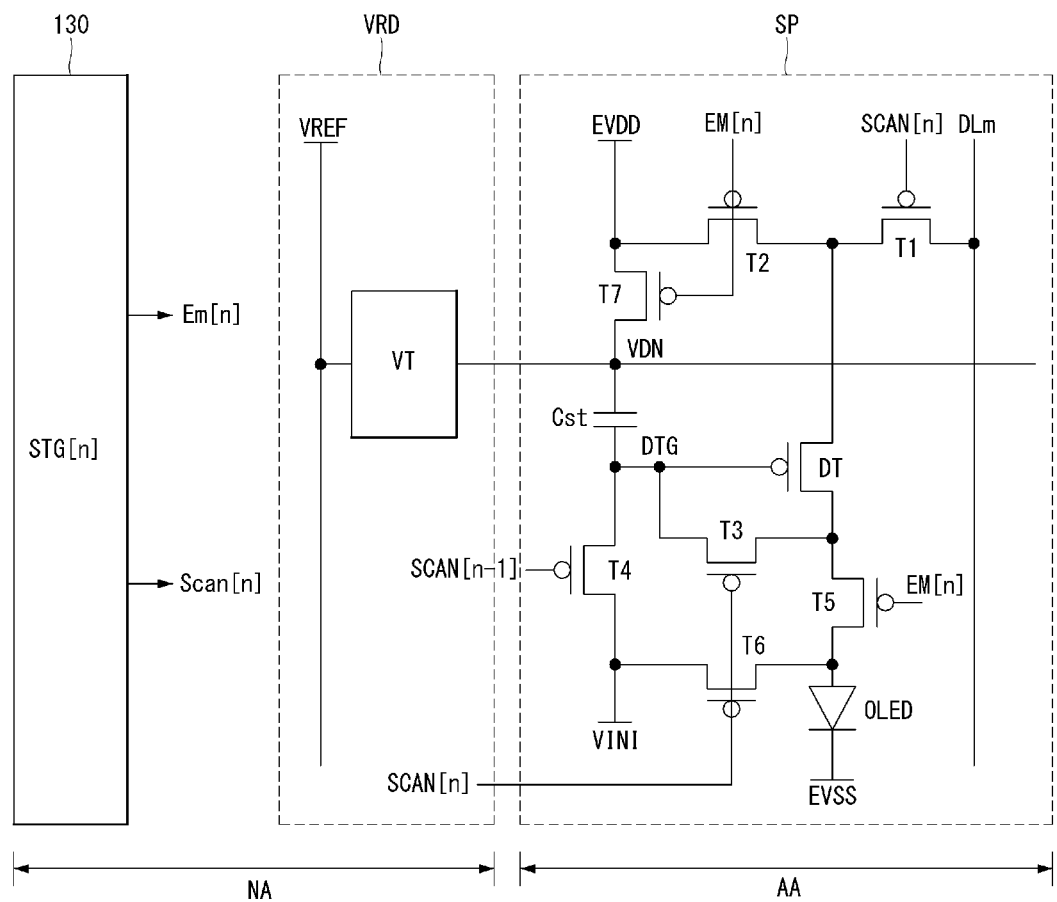
FIG. 6 is a block diagram of a display panel which schematically illustrates an electroluminescence display according to an embodiment of the present disclosure.
Figure 7:
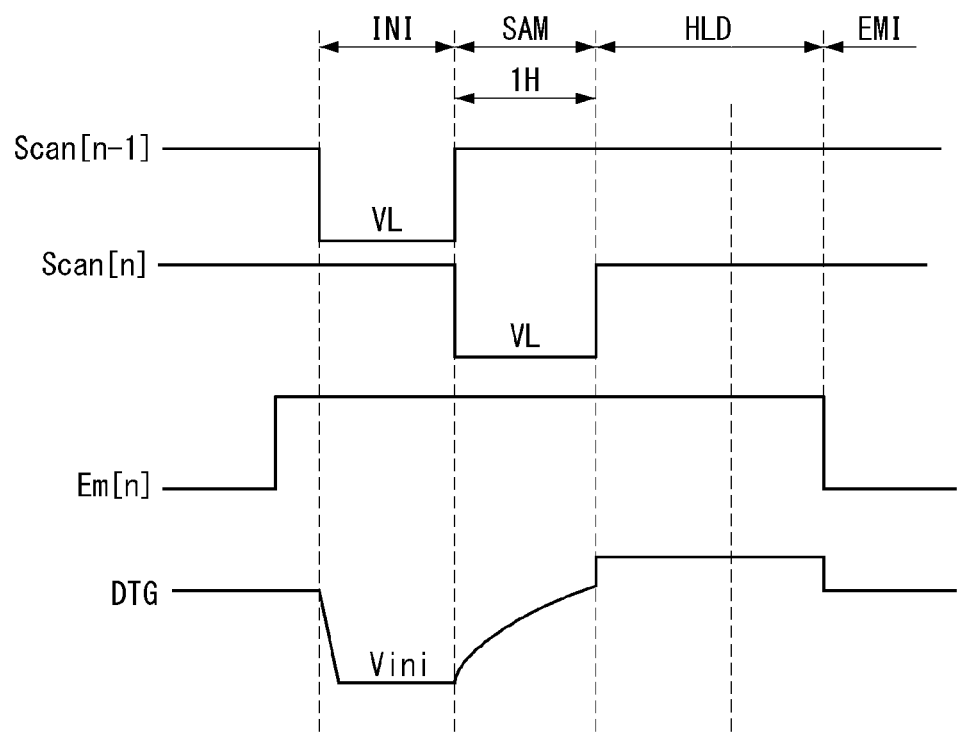
FIG. 7 is a waveform diagram explaining the drive characteristics of the subpixel of FIG. 6.

FIG. 6 is a block diagram of a display panel which schematically illustrates an electroluminescence display according to an embodiment of the present disclosure. FIG. 7 is a waveform diagram explaining some of the drive characteristics of the subpixel of FIG. 6.

As illustrated in FIGS. 6 and 7, the electroluminescence display according to the first embodiment comprise an nth voltage transfer part VRD that performs an operation for transferring an externally applied voltage to subpixels so as to compensate for voltage drop in the first power supply voltage applied to the nth subpixels SPs. Here, the term "externally" refers to the outside of the display area AA. The term voltage transfer part VRD is used interchangeable with the term voltage transfer transistor hereinafter, unless otherwise stated. The voltage transfer part VRD may represent at least one voltage transfer transistor that is located in the non-display area NA, wherein a gate of the at least one voltage transfer transistor is connected to the gate driver 130 and wherein the voltage transfer transistor is configured to transfer a reference voltage to a voltage transfer node of the subpixel SP in response to a signal applied from outside the display panel 150 or a signal generated on the display panel 150.

The nth voltage transfer part VRD is placed in the non-display area NA. For example, the nth voltage transfer part VRD may be placed between the gate driver 130 disposed in the non-display area NA of the display panel and the subpixels SPs disposed in the display area AA.

The gate driver 130 comprises an nth stage STG[n] that drives the nth subpixels SPs disposed in the nth scan line SCAN[n]. The nth stage STG[n] outputs the nth emission control signal Em[n] and nth scan signal Scan[n] for driving the nth subpixels. The nth voltage transfer part VRD may be placed to correspond to every scan line as well as the nth scan line SCAN[n]. A plurality of nth voltage transfer parts VRD may be provided. Also, the subpixels SPs may be highly integrated by placing the nth voltage transfer part VRD in the non-display area NA, rather than by placing the nth voltage transfer part VRD in each of the subpixels SPs disposed in the display area AA, and this allows for a high-resolution display panel.

The nth voltage transfer part VRD acts to transfer a reference voltage applied via a reference voltage line VREF to voltage transfer nodes VDN of the nth subpixels SPs during a specific period. The reference voltage may have a voltage level between the first power supply line EVDD and the second power supply line EVSS or a level equivalent to the first power supply voltage applied via the first power supply line EVDD.

The nth voltage transfer part VRD comprises at least one voltage transfer transistor VT. The at least one voltage transfer transistor VT is turned on or off in response to an externally applied control signal or a scan signal outputted from the gate driver 130. The externally applied control signal may refer to, but not limited to, a control signal outputted from the timing controller or power supply part, for example.

In the first embodiment, by way of example, the nth voltage transfer part VRD is placed separately and independently from the gate driver 130. However, the nth voltage transfer part VRD may be included in the gate driver 130. However, the nth voltage transfer part VRD may be included in one of the divided gate drivers according to FIG. 3, arranged at the first side or the second side of the display panel 150.

Placing the nth voltage transfer part VRD in the non-display area NA as in the first embodiment may offer advantages in terms of process over placing circuits for reference voltage application in the nth subpixels SPs. The advantages in terms of process are as follows. First, voltage can be transferred without placing circuits required for voltage transfer within the subpixels SPs, and the number of electrodes in each subpixel SP or the number of contacts on a wire can be reduced by placing the voltage transfer circuits outside the subpixels. This heavily reduces parasitic effects that may occur when arranging it in the subpixel SP. Second, the space limitations of the subpixels can be avoided, which is advantageous in high integration and prevents a decrease in aperture ratio when making a large-screen or high-resolution display panel.

An nth subpixel SP according to the first embodiment comprises first to seventh transistors T1 to T7, a driving transistor DT, a capacitor Cst, and an organic light-emitting diode OLED. The nth subpixel SP according to the first embodiment will be illustrated and described with an example in which it is implemented based on a total of 8 transistors, but the embodiment of the present specification is not limited to this example. The configuration and connections of the nth subpixel SP according to the first embodiment of the present disclosure will be described below. Such a configuration may be considered as a 7T1C subpixel circuit.

The first transistor T1 has a gate connected to the nth scan line SCAN[n], a first electrode connected to the mth data line DLm, and a second electrode connected to a first electrode of the second transistor T2 and a first electrode of the driving transistor DT. The first transistor T1 is turned on in response to the logic-low voltage VL of the Nth scan signal Scan[n] applied via the nth scan line SCAN[n]. When the first transistor T1 is turned on, a data voltage applied via the mth data line DLm is stored in the second electrode of the first transistor T1 (or between the first transistor and the second transistor).

The second transistor T2 has a gate connected to the nth emission control signal line EM[n], a first electrode connected to the second electrode of the first transistor T1, and a second electrode connected to the first power supply line EVDD and a first electrode of the seventh transistor T7. The second transistor T2 is turned on in response to the logic-low voltage VL of the nth emission control signal Em[n] applied via the nth emission control signal line EM[n]. When the second transistor T2 is turned on, a data voltage stored in the second electrode of the first transistor T1 is transferred to one electrode of the capacitor Cst through the second transistor T2 and the seventh transistor T7.

The third transistor T3 has a gate connected to the nth scan line SCAN[n], a first electrode connected to a second electrode of the driving transistor DT, and a second electrode connected to a gate of the driving transistor DT. The third transistor T3 is turned on in response to the logic-low voltage VL of the nth scan signal Scan[n] applied via the nth scan line SCAN[n]. When the third transistor T3 is turned on, the driving transistor DT is diode-connected.

The fourth transistor T4 has a gate connected to the (n−1)th scan line SCAN[n−1], a first electrode connected to an initial line VINI, and a second electrode connected to the other electrode of the capacitor Cst, the second electrode of the third transistor T3, and the gate of the driving transistor DT. The fourth transistor T4 is turned on in response to the logic-low voltage VL of the (n−1)th scan signal Scan[n−1] applied via the (n−1)th scan line SCAN[n−1]. When the fourth transistor T4 is turned on, the gate node DTG of the driving transistor DT is initialized based on the initial voltage Vini.

The fifth transistor T5 has a gate connected to the nth emission control signal line EM[n], a first electrode connected to the second electrode of the driving transistor DT, and a second electrode connected to the anode of the organic light-emitting diode OLED. The fifth transistor T5 is turned on in response to the logic-low voltage VL of the nth emission control signal Em[n] applied via the nth emission control signal line EM[n]. When the fifth transistor T5 is turned on, the organic light-emitting diode OLED emits light in response to a drive current generated through the driving transistor DT.

The sixth transistor T6 has a gate connected to the nth scan line SCAN[n], a first electrode connected to the initial line VINI, and a second electrode connected to the second electrode of the driving transistor DT and the anode of the organic light-emitting diode OLED. The sixth transistor T6 is turned on in response to the logic-low voltage VL of the nth scan signal Scan[n] applied via the nth scan line SCAN[n]. When the sixth transistor T6 is turned on, the anode of the organic light-emitting diode OLED is initialized based on the initial voltage Vini.

The seventh transistor T7 has a gate connected to the nth emission control signal line EM[n], a first electrode connected to the first power supply line EVDD and the second electrode of the second transistor T2, and a second electrode connected to one electrode of the capacitor Cst. The seventh transistor T7 is turned on in response to the logic-low voltage VL of the nth emission control signal Em[n] applied via the nth emission control signal line EM[n]. When the seventh transistor T7 is turned on, a data voltage stored in the second electrode of the first transistor T1 is transferred to the one electrode of the capacitor Cst through the second transistor T2.

One electrode of the capacitor Cst is connected to the second electrode of the seventh transistor T7, and the other electrode is connected to the second electrode of the fourth transistor T4. A node connected to the second electrode of the seventh transistor T7 and the one electrode of the capacitor Cst is defined as a voltage transfer node VDN which transfers the reference voltage. The anode of the organic light-emitting diode OLED is connected to the second electrode of the fifth transistor T5, and the cathode thereof is connected to the second power supply line EVSS.

The nth subpixel SP according to the first embodiment operates in a sequence of a first initial period INI, a sampling and second initial period SAM, a holding period HLD, and an emission period EMI. The first initial period INI is a period in which the gate node DTG of the driving transistor DT is initialized. The sampling and second initial period SAM is a period in which the threshold voltage of the driving transistor DT is sampled and the organic light-emitting diode OLED is initialized. The holding period HLD is a period in which a data voltage applied via the mth data line DLm is held in a particular node. The emission period EMI is a period in which the organic light-emitting diode OLED emits light by a drive current generated based on the data voltage.

For the Nth subpixel SP according to the first embodiment, internal circuit-based compensation is done as the first initial period INI and the sampling and second initial period SAM occur while the nth emission control signal Em[n] is not applied (the logic-high voltage is maintained). The operating characteristics during these periods will be described below in brief. By way of example, the low-logic voltage is applied in response to the (n−1)th scan signal Scan[n−1] and the Nth scan signal Scan[n] during 1 horizontal time 1H. Also, by way of example, the first initial period INI and the sampling and second initial period SAM each occur during 1 horizontal time 1H.

During the first initial period INI, the fourth transistor T4 is turned on in response to the logic-low voltage VL of the (n−1)th scan signal Scan[n−1] applied via the (n−1)th scan line SCAN[n−1]. In this case, the initial voltage Vini, lower than the first power supply voltage applied via the first power supply line EVDD, is applied to the initial line VINI. By this operation, the gate node DTG of the driving transistor DT is initialized based on the initial voltage Vini.

During the sampling and second initial period SAM, the first transistor T1, third transistor T3, and sixth transistor T6 are turned on in response to the logic-low voltage VL of the nth scan signal Scan[n] applied via the nth scan line SCAN[n]. A data voltage applied via the mth data line DLm is applied to the first electrode of the driving transistor DT by the turn-on of the first transistor T1. By the turn-on of the third transistor T3, the driving transistor DT is diode-connected, and the threshold voltage of the driving transistor DT is sampled. The data voltage applied to the first electrode of the driving transistor DT is stored in the gate node DTG. The organic light-emitting diode OLED is initialized based on the initial voltage Vini by the turn-on of the sixth transistor T6.

During the emission period EMI, the second transistor T2, seventh transistor T7, and fifth transistor T5 are turned on in response to the logic-low voltage VL of the emission control signal Em[n] applied via the nth emission control signal line EM[n]. The first power supply voltage applied via the first power supply line EVDD is applied to the first electrode of the driving transistor DT by the turn-on of the second transistor T2. The first power supply voltage applied via the first power supply line EVDD is applied to the voltage transfer node VDN, which is one electrode of the capacitor Cst, by the turn-on of the seventh transistor T7. In this case, the voltage of the gate node DTG of the driving transistor DT, which is the other electrode of the capacitor Cst, is varied due to coupling by the amount of change from the reference voltage Vref to the first power supply voltage.

The nth subpixel SP according to the first embodiment is supplied with the reference voltage from the nth voltage transfer part VRD during the first initial period INI and the sampling and second initial period SAM so that voltage drops in the first power supply voltage are taken into consideration. The resulting current in the nth subpixel SP may be represented by the following current equation:

$$Ioled=K(Vsg-|Vth|)^2=K\{(VDD-(Vdata-|Vth|+VDD-Vref)-|Vth|\}^2=K(Vref-Vdata)^2$$

wherein Ioled is the current flowing through the organic light-emitting diode OLED, K is a constant, Vsg is the voltage between the source and the gate of the driving transistor DT, Vth is the threshold voltage of the driving transistor DT, VDD is the first power supply voltage applied via the first power supply line EVDD, Vref is the reference voltage applied via the reference voltage line VREF, and Vdata is a data voltage applied via the mth data line DLm.

As can be seen from the above equation, Ioled is determined by the difference between the reference voltage and the data voltage. From the equation, it can be seen that, for the nth subpixel SP according to the first embodiment, voltage drops in the first power supply voltage applied via the first power supply line EVDD are compensated for by the reference voltage applied during the first initial period INI and the sampling and second initial period SAM.

Hereinafter, a more detailed description of the first embodiment will be given below with an example in which the nth voltage transfer part VRD includes two voltage transfer transistors.

Figure 8:
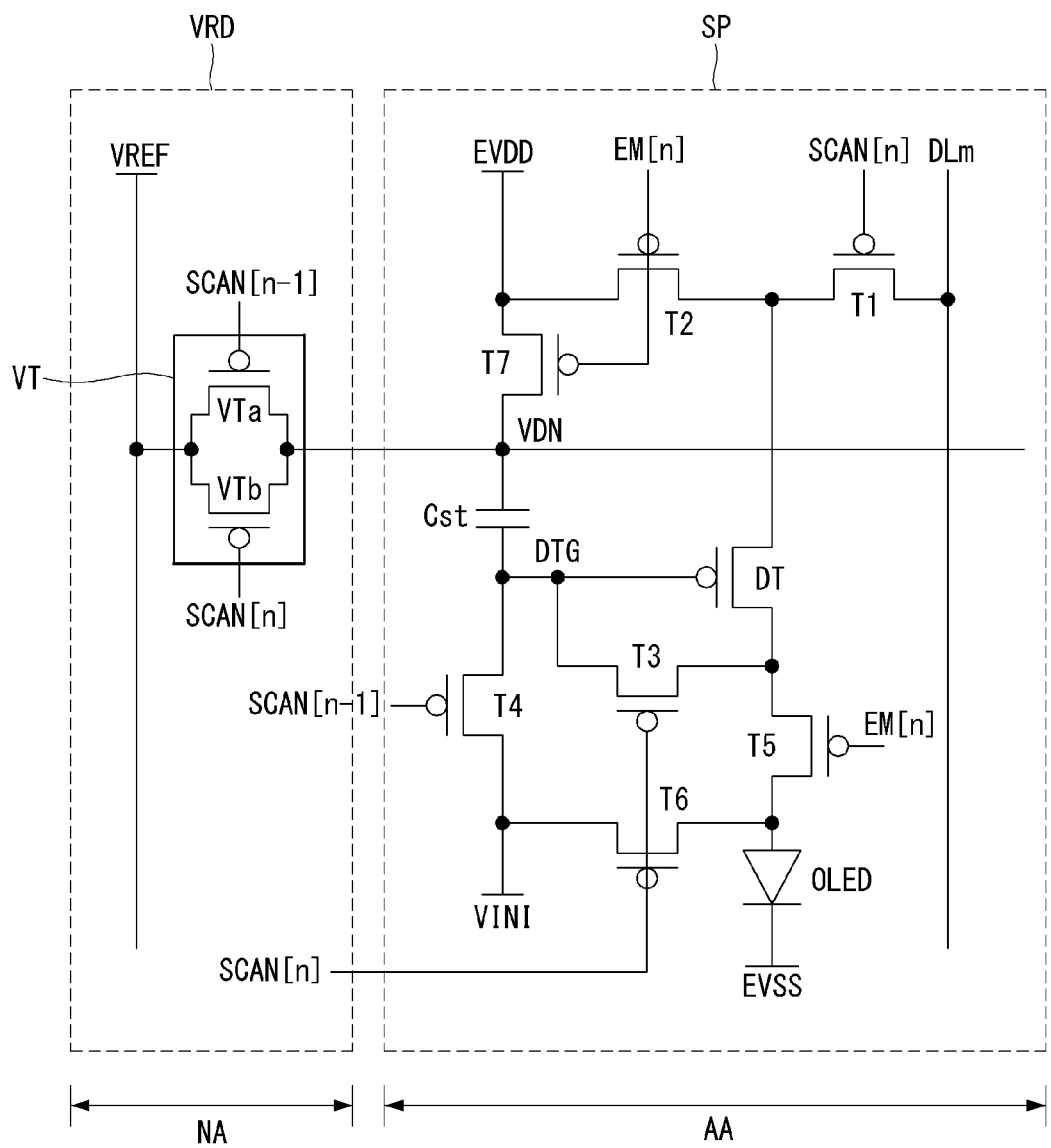
FIG. 8 is a view showing in more detail the configuration of an Nth voltage transfer part according to the first embodiment of the present disclosure.

FIG. 8 is a view showing in more detail the configuration of an nth voltage transfer part according to the first embodiment of the present disclosure. FIGS. 9 to 16 are views explaining in more detail the driving method according to the configuration of FIG. 8.

As illustrated in FIG. 8, the nth voltage transfer part VT comprises a first voltage transfer transistor VTa and a second voltage transfer transistor Vtb. The first voltage transfer transistor VTa is turned on or off in response to the (n−1)th scan signal applied via the (n−1)th scan line SCAN[n−1]. The second voltage transfer transistor Vtb is turned on or off in response to the nth scan signal applied through the nth scan line SCAN[n].

The first voltage transfer transistor VTa has a gate connected to the (n−1)th scan line SCAN[n−1], a first electrode connected to the reference voltage line VREF, and a second electrode connected to the second electrode of the seventh transistor T7 and the voltage transfer node VDN, which is one electrode of the capacitor Cst. The second voltage transfer transistor VTb has a gate connected to the nth scan line SCAN[n], a first electrode connected to the reference voltage line VREF, and a second electrode connected to the second electrode of the seventh transistor T7 and the voltage transfer node VDN, which is one electrode of the capacitor Cst. That is, the gates of the first voltage transfer transistor VTa and the second voltage transfer transistor VTb are connected to different scan lines, and the first electrodes thereof are connected to each other and the second electrodes thereof are connected to each other.

Hereinafter, the driving method according to the first embodiment will be described below in conjunction with the nth voltage transfer part VT and the nth subpixel SP. In the description below, the transistors marked by a slash are turned-off transistors, and the other transistors are turned-on transistors.

Figure 9:
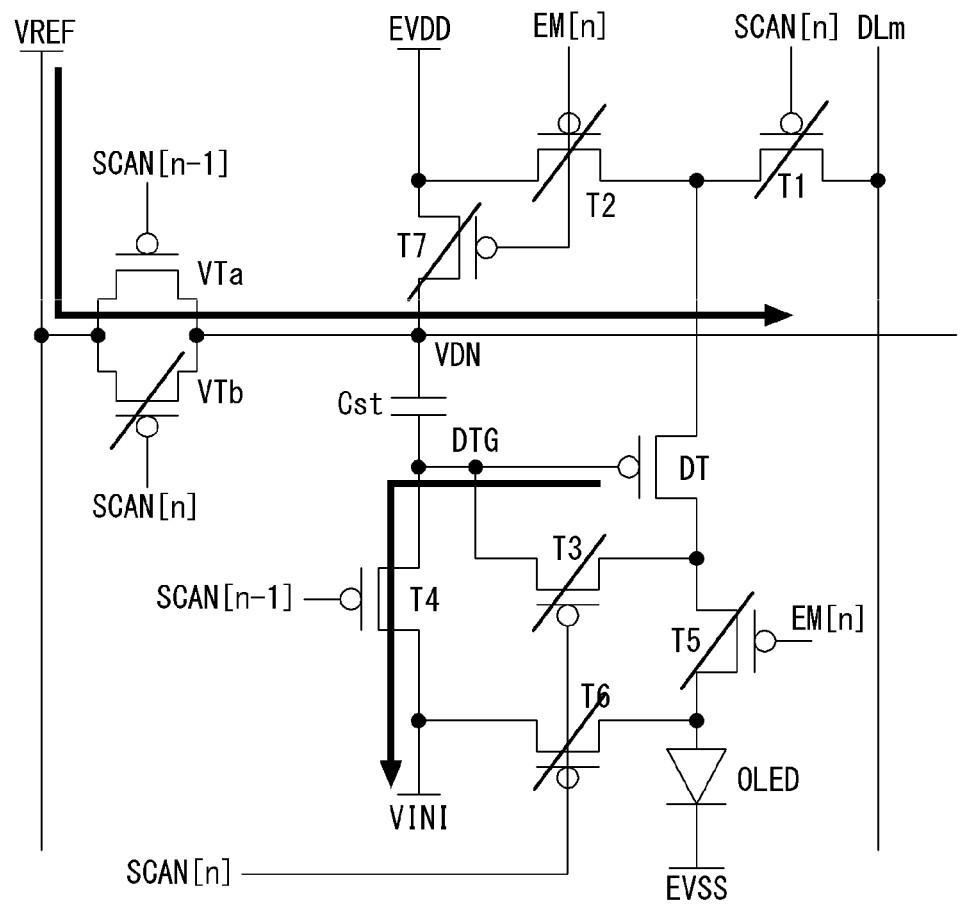
FIGS. 9 to 16 are views explaining in more detail the driving method according to the configuration of FIG. 8.
Figure 10:
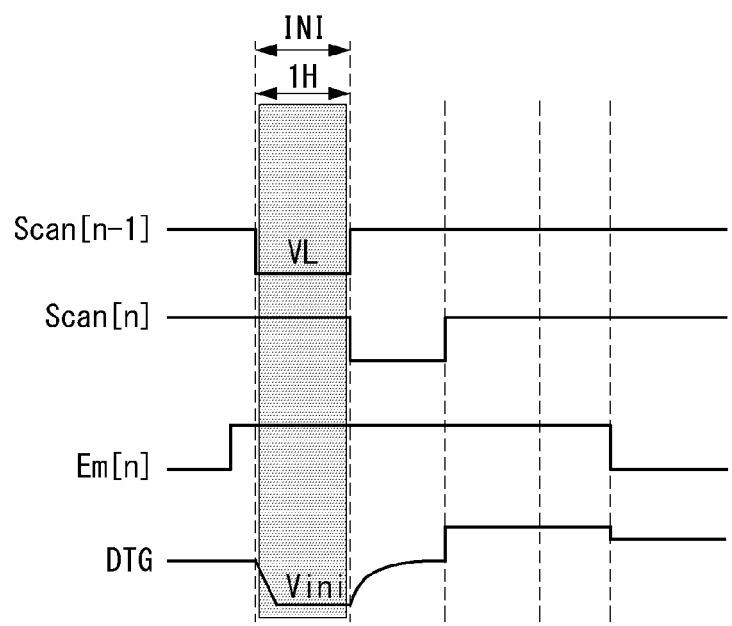

FIGS. 9 and 10 are views showing an operation during a first initial period and the resulting drive waveforms according to the configuration of FIG. 8.

As illustrated in FIGS. 9 and 10, during the first initial period INI, the first voltage transfer transistor VTa is turned on in response to the logic-low voltage VL of the (n−1)th scan signal Scan[n−1] applied via the (n−1)th scan line SCAN[n−1]. In this case, the reference voltage transferred via the reference voltage line VREF is applied to the nth subpixels via the turned-on first voltage transfer transistor VTa. By this operation, the reference voltage is stored at one electrode of the capacitor Cst.

Moreover, during the first initial period INI, the fourth transistor T4 is turned on in response to the logic-low voltage VL of the (n−1)th scan signal Scan[n−1] applied via the (n−1)th scan line SCAN[n−1]. In this case, the initial voltage, lower than the first power supply voltage applied via the first power supply line EVDD, is applied to the initial line VINI. By this operation, the gate node DTG of the driving transistor DT is initialized based on the initial voltage Vini (or residual voltage is released).

Figure 11:
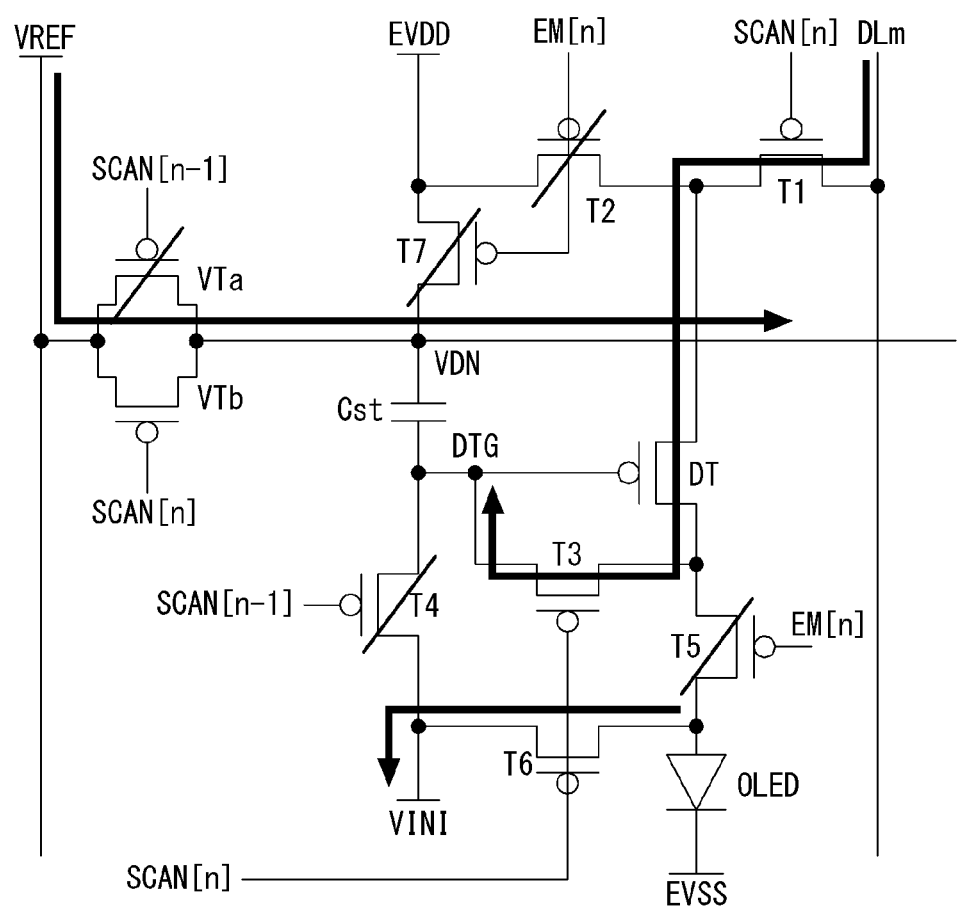
Figure 12:
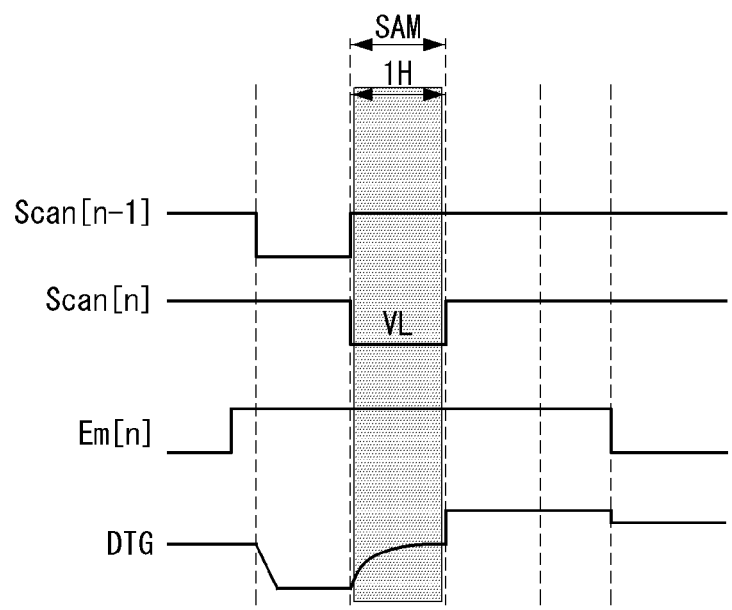

FIGS. 11 and 12 are views showing an operation during a sampling and second initial period and the resulting drive waveforms according to the configuration of FIG. 8.

As illustrated in FIGS. 11 and 12, during the sampling and second initial period SAM, the second voltage transfer transistor VTb is turned on in response to the logic-low voltage VL of the nth scan signal Scan[n] applied via the nth scan line SCAN[n]. In this case, the reference voltage transferred via the reference voltage line VREF is applied to the nth subpixels via the turned-on second voltage transfer transistor VTb. By this operation, the reference voltage is continuously stored at one electrode of the capacitor Cst.

Moreover, during the sampling and second initial period SAM, the first transistor T1, third transistor T3, and sixth transistor T6 are turned on in response to the logic-low voltage VL of the nth scan signal Scan[n] applied via the nth scan line SCAN[n]. A data voltage applied via the mth data line DLm is applied to the first electrode of the driving transistor DT by the turn-on of the first transistor T1. The driving transistor DT is diode-connected by the turn-on of the third transistor T3. The threshold voltage of the driving transistor DT is sampled by the turn-on of the third transistor T3. The data voltage applied to the first electrode of the driving transistor DT is stored in the gate node DTG via the third transistor T3. The organic light-emitting diode OLED is initialized based on the initial voltage Vini by the turn-on of the sixth transistor T6.

Figure 13:
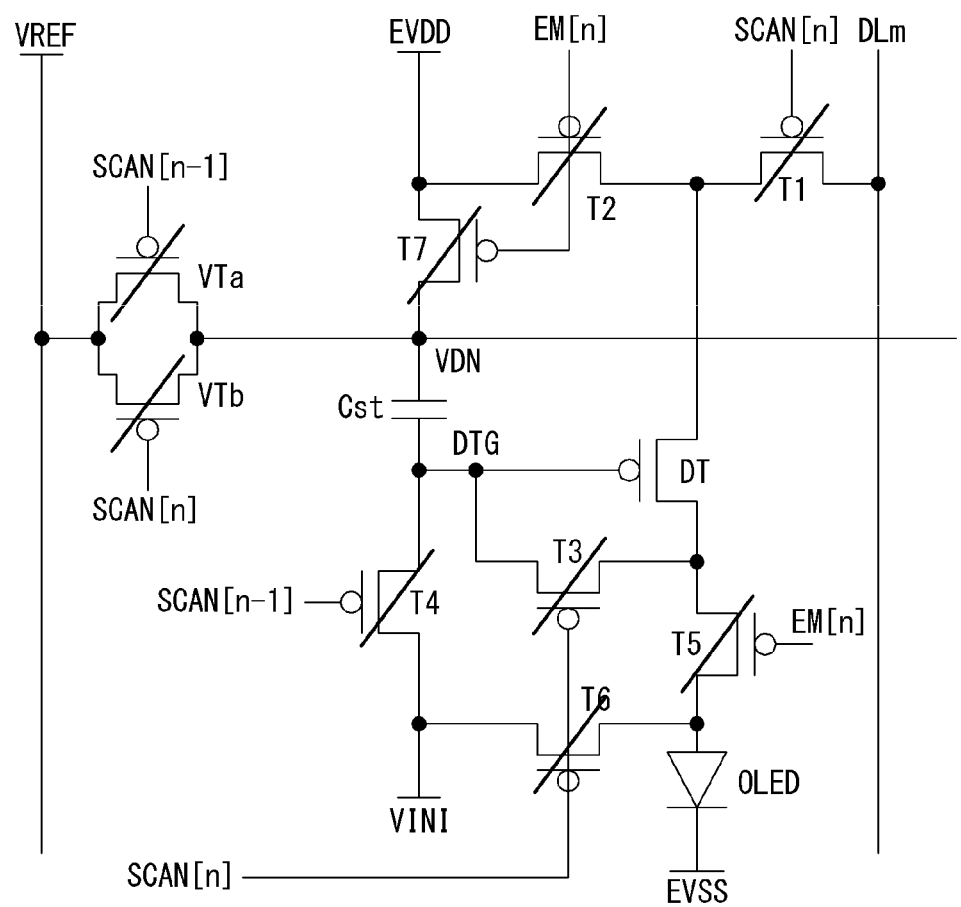
Figure 14:
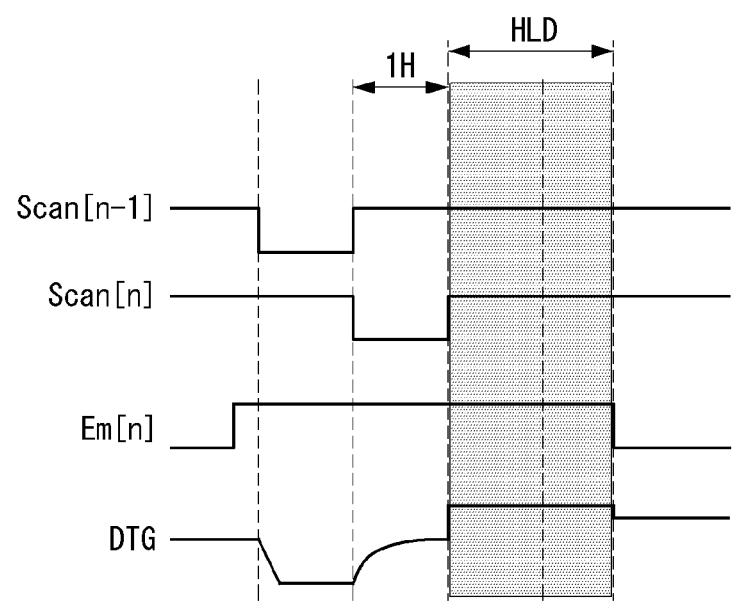

FIGS. 13 and 14 are views showing an operation during a holding period and the resulting drive waveforms according to the configuration of FIG. 8.

As illustrated in FIGS. 13 and 14, during the holding period HLD, the first voltage transfer transistor VTa is turned off in response to the logic-high voltage VH of the (n−1)th scan signal Scan[n−1] applied via the (n−1)th scan line SCAN[n−1]. The second voltage transfer transistor VTb is turned off in response to the logic-high voltage VH of the nth scan signal Scan[n] applied via the nth scan line SCAN[n].

Moreover, during the holding period HLD, the first to seventh transistors T1 to T7 are turned off in response to the logic-high voltage VH of the (n−1)th scan signal Scan[n−1], nth scan signal Scan[n], and nth emission control signal Em[n]. By this operation, the capacitor Cst stores and holds a data voltage based on the voltage difference between the two ends.

Figure 15:
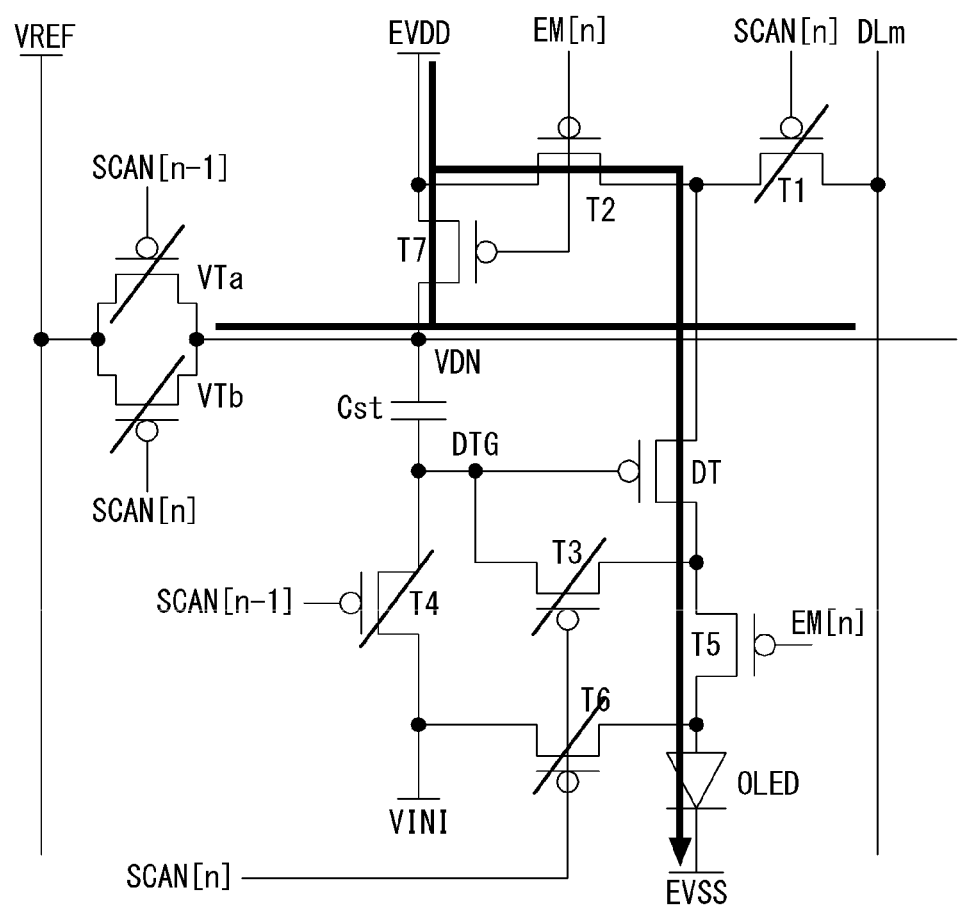
Figure 16:
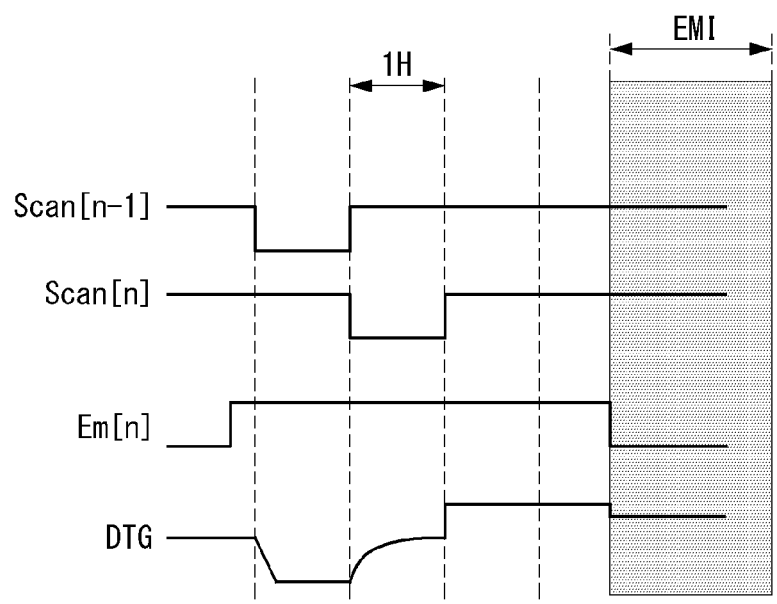

FIGS. 15 and 16 are views showing an operation during an emission period and the resulting drive waveforms according to the configuration of FIG. 8.

As illustrated in FIGS. 15 and 16, during the emission period EMI, the first voltage transfer transistor VTa and the second voltage transfer transistor VTb are kept turned off, as is during the holding period HLD.

Moreover, during the emission period EMI, the second transistor T2, fifth transistor T5, and seventh transistor T7 are turned on in response to the logic-low voltage VL of the nth emission control signal Em[n]. By the turn-on of the second transistor T2, fifth transistor T5, and seventh transistor T7, the driving transistor DT are turned on while generating a drive current based on a data voltage obtained by threshold voltage compensation.

The variations in the voltage of the voltage transfer node, the voltages of the gate node, source node, and drain node of the driving transistor, the threshold voltage Vth of the driving transistor, and the drive current Ioled flowing through the organic light-emitting diode, during the time from the first initial period INI to the emission period EMI, are shown in the following table. In Table 1 below, the first power supply voltage is denoted by VDD, and the reference voltage is denoted by Vref.

TABLE 1

| | First initial period (INI) | Sampling and second initial period (SAM) | Holding period (HLD) | Emission period (EMI) |
|---|---|---|---|---|
| Voltage transfer node | Vref | Vref | Vref | VDD |
| Gate node of driving transistor | Vini | Vdata − \|Vth\| | Same as before | Vdata − \|Vth\| + (VDD − Vref) |
| Source node of driving transistor | — | Vdata | Same as before | VDD |
| Drain node of driving transistor | — | Vdata − \|Vth\| | Same as before | — |
| Drive current | | Ioled = K(Vsg − \|Vth\|)$^2$ = K{VDD − (Vdata − \|Vth\| + VDD − Vref) − \|Vth\|)}$^2$ = K(Vref − Vdata)$^2$ | | |

As can be seen from the above description, the first embodiment can prevent or solve picture quality issues such as vertical luminance non-uniformity or crosstalk on the display panel since defect issues caused by voltage drop in the first power supply voltage can be prevented or solved. Moreover, the first embodiment can reduce the number of electrodes in each subpixel or the number of contacts on a wire by placing circuits for transferring reference voltage to the subpixels, and also can offer advantages in high integration and therefore prevents a decrease in aperture ratio when making a large-screen or high-resolution display panel.

Second Embodiment

Figure 17:
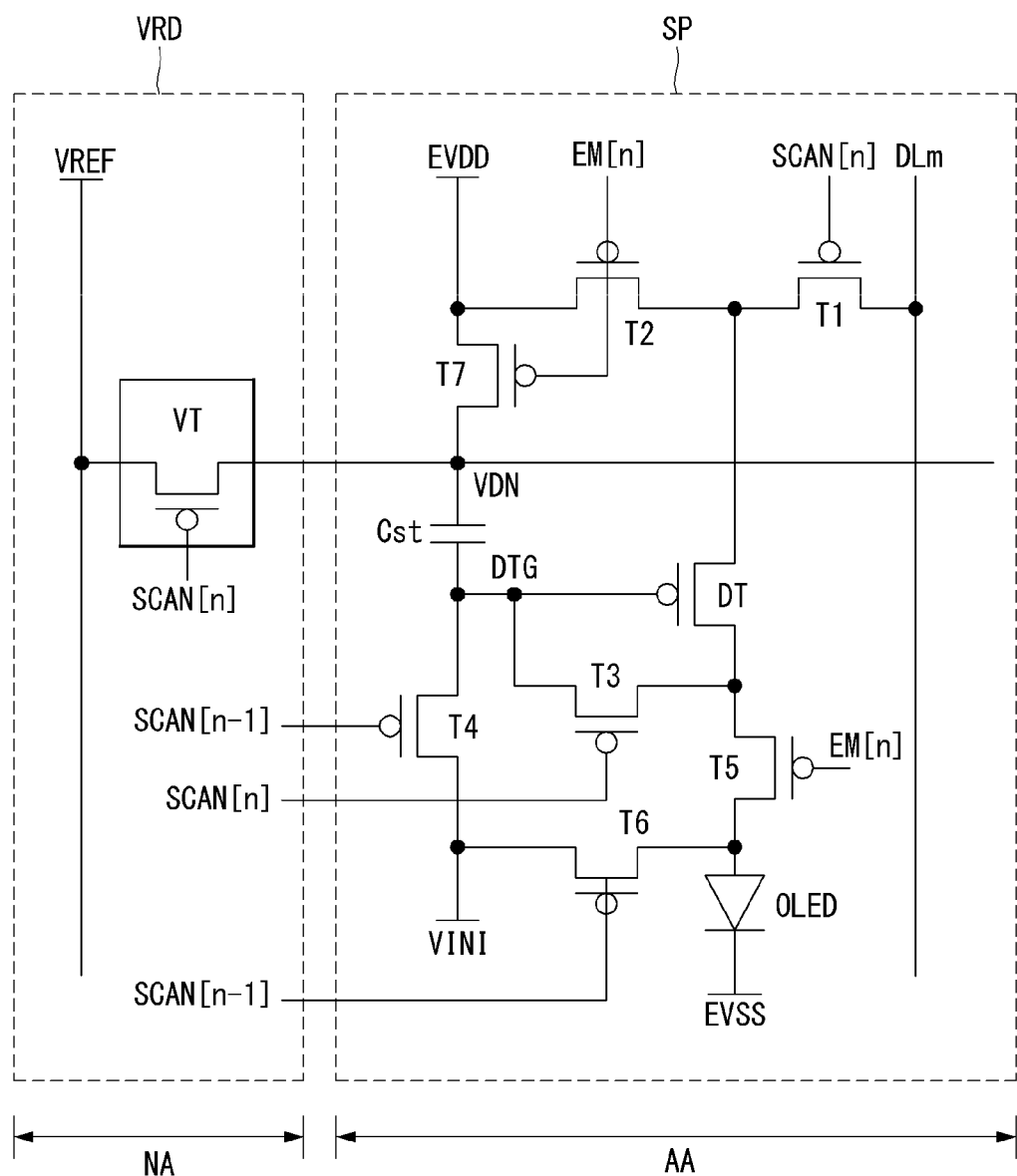
FIG. 17 is a diagram of the configuration of a display panel which schematically explains an electroluminescence display according to a second embodiment of the present disclosure.
Figure 18:
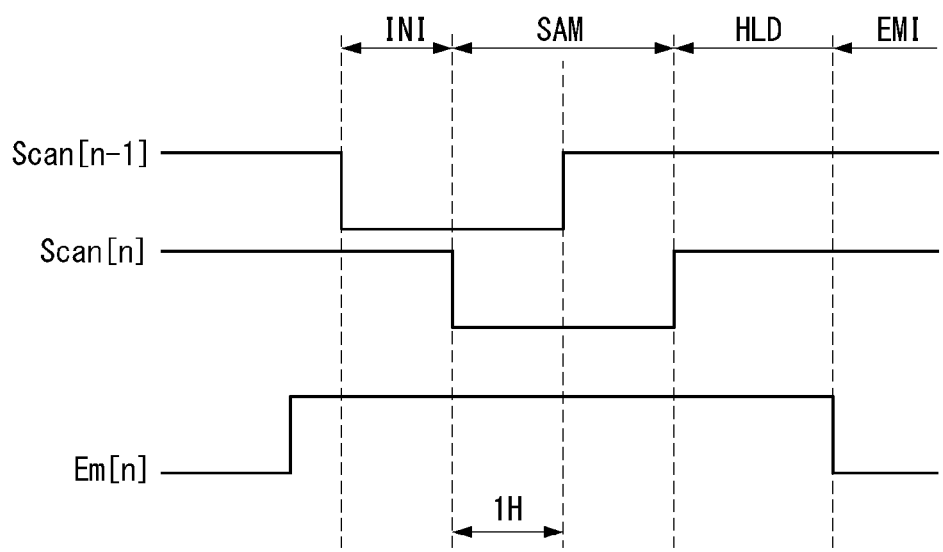
FIG. 18 is a waveform diagram explaining some of the drive characteristics of the subpixel circuit of FIG. 17.

FIG. 17 is a diagram of the configuration of a display panel which schematically explains an electroluminescence display according to a second embodiment of the present disclosure. FIG. 18 is a waveform diagram explaining some of the drive characteristics of the subpixel circuit of FIG. 17. The second embodiment of the present disclosure is a modification of the first embodiment, so redundancies between the first and second embodiments will be omitted or described briefly.

As illustrated in FIGS. 17 and 18, the electroluminescence display according to the second embodiment comprise an Nth voltage transfer part VRD that performs an operation for transferring an externally applied voltage to subpixels so as to compensate for voltage drop in the first power supply voltage applied to the nth subpixels SPs. Here, the term "externally" refers to the outside of the display area AA.

The nth voltage transfer part VRD is placed in the non-display area NA. The nth voltage transfer part VRD acts to transfer a reference voltage applied via a reference voltage line VREF to voltage transfer nodes VDN of the nth subpixels SPs during a specific period. The nth voltage transfer part VRD comprises one voltage transfer transistor VT.

The voltage transfer transistor VT has a gate connected to the nth scan line SCAN[n], a first electrode connected to the reference voltage line VREF, and a second electrode connected to the second electrode of the seventh transistor T7 and one electrode of the capacitor Cst. The voltage transfer transistor VT is turned on or off in response to the nth scan signal Scan[n] applied via the nth scan line SCAN[n].

In the second embodiment, enough time will be given for the first initial period INI and the sampling and second initial period SAM by configuring signals in such a way that the logic-low voltage part of at least 1 horizontal time 1H overlaps between the previous scan signal and the current scan signal. Therefore, the nth voltage transfer part VRD may comprise a single voltage transfer transistor VT by configuring the (n–1)th scan line SCAN[n–1] and the nth scan line SCAN[n] in such a way that their logic-low voltage parts overlap.

In the second embodiment, the nth voltage transfer part VRD can be kept turned on for at least 2 horizontal times, without changing from the turned-off state to the turned-on state for a specific period of time, since the previous scan signal and the current scan signal overlap when applied. Thus, power supply can be prevented from being cut off when the reference voltage is transferred, or the nodes can be prevented from electrically floating. Moreover, in the second embodiment, the nth voltage transfer part VRD comprises a single voltage transfer transistor VT, thereby simplifying the circuits enough to further reduce the non-display area (or bezel area) of the display panel.

As opposed to scan signals for 1 horizontal time, scan signals for 2 horizontal times may have a compensation period only when the pulses overlap. Thus, applying the reference voltage to the subpixels during the initial period INI may be necessary depending on whether the scan signals overlap or not. By applying the reference voltage from the initial period INI onward, power supply can be prevented from being cut off when the reference voltage is transferred, or the nodes can be prevented from electrically floating.

An nth subpixel SP according to the second embodiment comprises first to seventh transistors T1 to T7, a driving transistor DT, a capacitor Cst, and an organic light-emitting diode OLED. In the nth subpixel SP according to the second embodiment, the driving transistor DT and the organic light-emitting diode OLED are simultaneously initial, unlike the first embodiment. The configuration and connections of the nth subpixel SP according to the second embodiment of the present disclosure will be described below.

The first transistor T1 has a gate connected to the nth scan line SCAN[n], a first electrode connected to the mth data line DLm, and a second electrode connected to a first electrode of the second transistor T2 and a first electrode of the driving transistor DT. The first transistor T1 is turned on in response to the logic-low voltage VL of the nth scan signal Scan[n] applied via the nth scan line SCAN[n]. When the first transistor T1 is turned on, a data voltage applied via the mth data line DLm is stored in the second electrode of the first transistor T1.

The second transistor T2 has a gate connected to the nth emission control signal line EM[n], a first electrode connected to the second electrode of the first transistor T1, and a second electrode connected to the first power supply line EVDD and a first electrode of the seventh transistor T7. The second transistor T2 is turned on in response to the logic-low voltage VL of the nth emission control signal Em[n] applied via the nth emission control signal line EM[n]. When the second transistor T2 is turned on, a data voltage stored in the second electrode of the first transistor T1 is transferred to one electrode of the capacitor Cst through the seventh transistor T7.

The third transistor T3 has a gate connected to the nth scan line SCAN[n], a first electrode connected to a second electrode of the driving transistor DT, and a second electrode connected to a gate of the driving transistor DT. The third transistor T3 is turned on in response to the logic-low voltage VL of the nth scan signal Scan[n] applied via the nth scan line SCAN[n]. When the third transistor T3 is turned on, the driving transistor DT is diode-connected.

The fourth transistor T4 has a gate connected to the (n–1)th scan line SCAN[n–1], a first electrode connected to an initial line VINI, and a second electrode connected to the other electrode of the capacitor Cst, the second electrode of the third transistor T3, and the gate of the driving transistor DT. The fourth transistor T4 is turned on in response to the logic-low voltage VL of the (n–1)th scan signal Scan[n–1] applied via the (n–1)th scan line SCAN[n–1]. When the fourth transistor T4 is turned on, the gate node DTG of the driving transistor DT is initial based on the initial voltage Vini.

The fifth transistor T5 has a gate connected to the nth emission control signal line EM[n], a first electrode connected to the second electrode of the driving transistor DT, and a second electrode connected to the anode of the organic light-emitting diode OLED. The fifth transistor T5 is turned on in response to the logic-low voltage VL of the nth emission control signal Em[n] applied via the nth emission control signal line EM[n]. When the fifth transistor T5 is turned on, the organic light-emitting diode OLED emits light in response to a drive current generated through the driving transistor DT.

The sixth transistor T6 has a gate connected to the (n−1)th scan line SCAN[n−1], a first electrode connected to the initial line VINI, and a second electrode connected to the second electrode of the driving transistor DT and the anode of the organic light-emitting diode OLED. The sixth transistor T6 is turned on in response to the logic-low voltage of the (n−1)th scan signal Scan[n−1] applied via the (n−1)th scan line SCAN[n−1]. When the sixth transistor T6 is turned on, the anode of the organic light-emitting diode OLED is initialized based on the initial voltage Vini.

The seventh transistor T7 has a gate connected to the nth emission control signal line EM[n], a first electrode connected to the first power supply line EVDD and the second electrode of the second transistor T2, and a second electrode connected to one electrode of the capacitor Cst. The seventh transistor T7 is turned on in response to the logic-low voltage VL of the nth emission control signal Em[n] applied via the nth emission control signal line EM[n]. When the seventh transistor T7 is turned on, a data voltage stored in the second electrode of the first transistor T1 is transferred to the one electrode of the capacitor Cst through the second transistor T2.

One electrode of the capacitor Cst is connected to the second electrode of the seventh transistor T7, and the other electrode is connected to the second electrode of the fourth transistor T4. The anode of the organic light-emitting diode OLED is connected to the second electrode of the fifth transistor T5, and the cathode thereof is connected to the second power supply line EVSS.

The Nth subpixel SP according to the second embodiment operates in a sequence of an initial period INI, a sampling period SAM, a holding period HLD, and an emission period EMI. The initial period INI is a period in which the gate node DTG of the driving transistor DT and the organic light-emitting diode OLED are simultaneously initialized. The sampling period SAM is a period in which the threshold voltage of the driving transistor DT is sampled. The holding period HLD is a period in which a data voltage applied via the mth data line DLm is held in a particular node. The emission period EMI is a period in which the organic light-emitting diode OLED emits light by a drive current generated based on the data voltage.

For the nth subpixel SP according to the second embodiment, internal circuit-based compensation is done as the initial period INI and the sampling period SAM occur while the nth emission control signal Em[n] is not applied (the logic-high voltage is maintained). The operating characteristics during these periods will be described below in brief. By way of example, the low-logic voltage is applied in response to the (n−1)th scan signal Scan[n−1] and the nth scan signal Scan[n] during 2 horizontal times 2H, and the two signals overlap during 1 horizontal time 1H.

During the first initial period INI, the fourth transistor T4 and the sixth transistor T6 are simultaneously turned on in response to the logic-low voltage VL of the (n−1)th scan signal Scan[n−1] applied via the (n−1)th scan line SCAN[n−1]. In this case, the initial voltage, lower than the first power supply voltage applied via the first power supply line EVDD, is applied to the initial line VINI. By this operation, the gate node DTG of the driving transistor DT and the organic light-emitting diode OLED are initialized based on the initial voltage.

During the sampling period SAM, the first transistor T1 and the third transistor T3 are turned on in response to the logic-low voltage VL of the nth scan signal Scan[n] applied via the Nth scan line SCAN[n]. A data voltage applied via the mth data line DLm is transferred to the nth subpixel SP by the turn-on of the first transistor T1. By the turn-on of the third transistor T3, the driving transistor DT is diode-connected. By the turn-on of the third transistor T3, the threshold voltage of the driving transistor DT is sampled.

The nth subpixel SP according to the second embodiment is supplied with the reference voltage from the nth voltage transfer part VRD during the initial period INI and the sampling period SAM so that voltage drops in the first power supply voltage are taken into consideration. Accordingly, for the nth subpixel according to the second embodiment as well, voltage drops in the first power supply voltage applied via the first power supply line EVDD may be compensated for by the reference voltage.

Therefore, the second embodiment may offer the same benefit as the first embodiment since the nth voltage transfer part VRD is capable of applying the reference voltage during the initial period INI and the sampling period SAM. Moreover, in the second embodiment, power supply can be prevented from being cut off when the reference voltage is transferred, or the nodes can be prevented from electrically floating. In addition, in the second embodiment, the nth voltage transfer part VRD comprises a single voltage transfer transistor VT, thereby simplifying the circuits enough to further reduce the non-display area (or bezel area) of the display panel.

Third Embodiment

Figure 19:
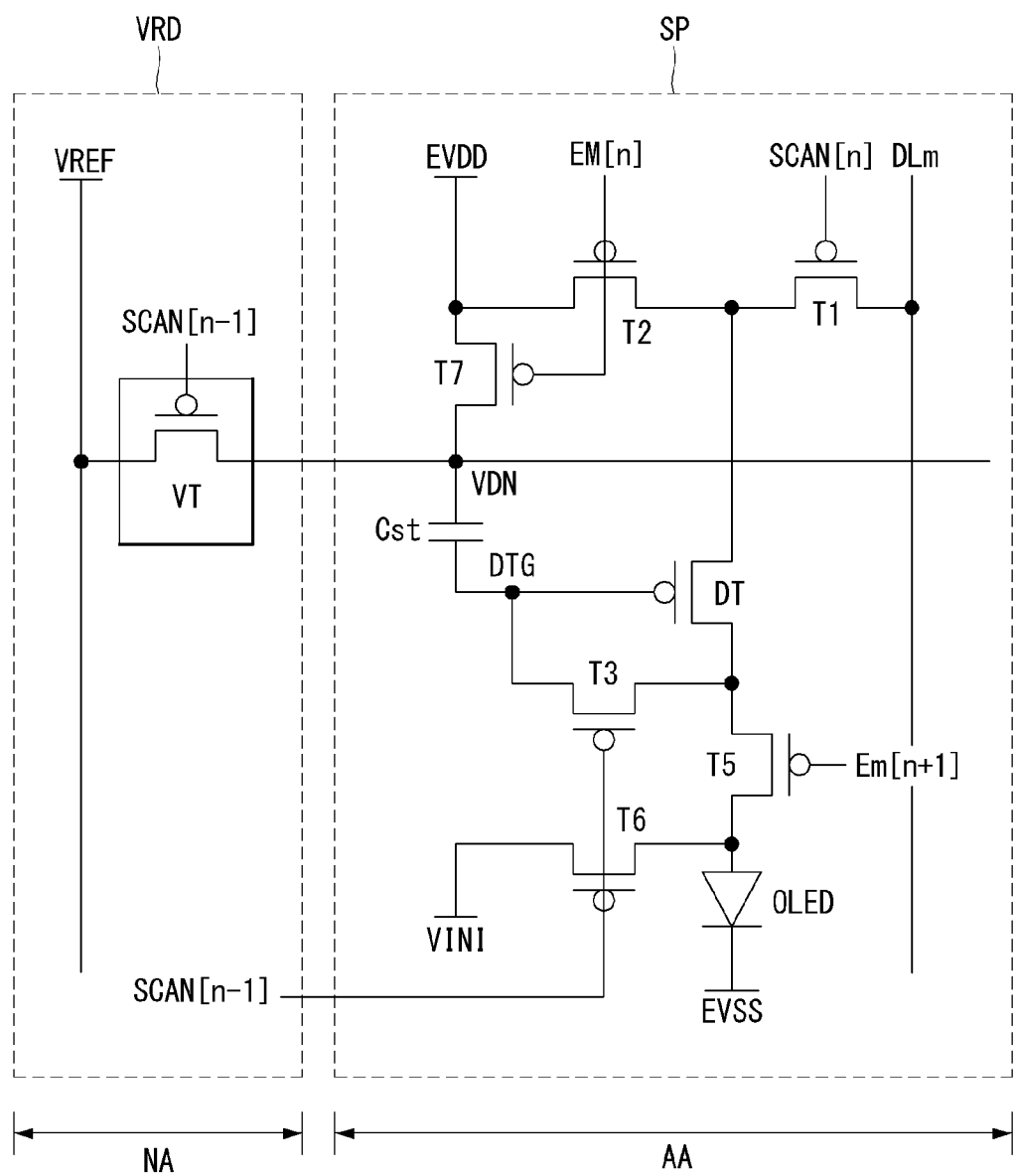
FIG. 19 is a diagram of the configuration of a display panel which schematically explains an electroluminescence display according to a third embodiment of the present disclosure.
Figure 20:
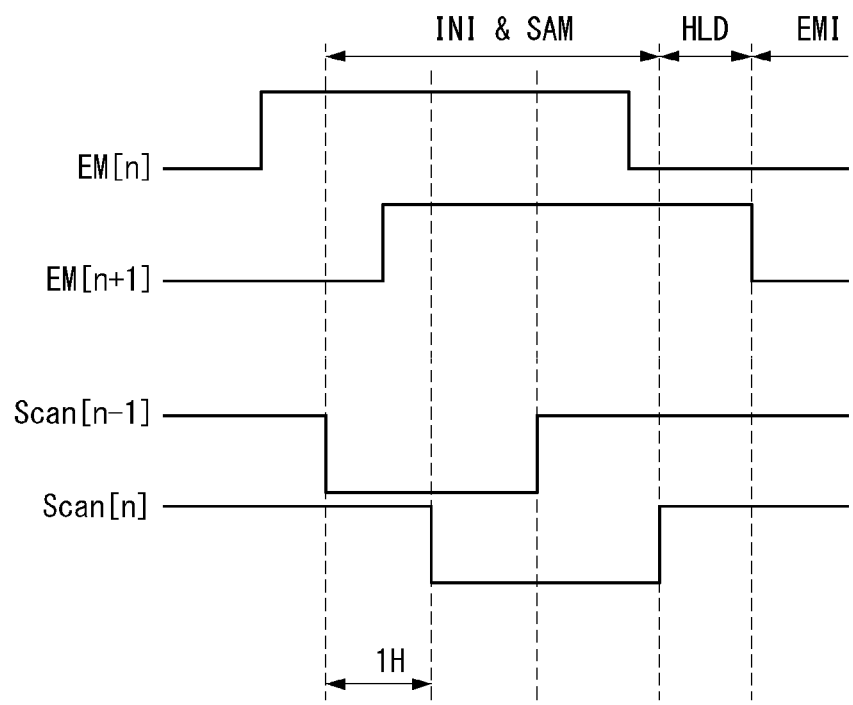
FIG. 20 is a waveform diagram explaining some of the drive characteristics of the subpixel circuit of FIG. 19.

FIG. 19 is a diagram of the configuration of a display panel which schematically explains an electroluminescence display according to a third embodiment of the present disclosure. FIG. 20 is a waveform diagram explaining some of the drive characteristics of the subpixel circuit of FIG. 19. The third embodiment of the present disclosure is a modification of the first and/or second embodiments, so redundancies between the third embodiment and the first and second embodiments will be omitted or described briefly.

As illustrated in FIGS. 19 and 20, the electroluminescence display according to the third embodiment comprise an nth voltage transfer part VRD that performs an operation for transferring an externally applied voltage to subpixels so as to compensate for voltage drop in the first power supply voltage applied to the nth subpixels SPs. Here, the term "externally" refers to the outside of the display area AA.

The nth voltage transfer part VRD is placed in the non-display area NA. The nth voltage transfer part VRD acts to transfer a reference voltage applied via a reference voltage line VREF to voltage transfer nodes VDN of the nth subpixels SPs during a specific period. The nth voltage transfer part VRD comprises one voltage transfer transistor VT.

The voltage transfer transistor VT has a gate connected to the (n−2)th scan line SCAN[n−1], a first electrode connected to the reference voltage line VREF, and a second electrode connected to the second electrode of the seventh transistor T7 and the voltage transfer node VDN, which is one electrode of the capacitor Cst. The voltage transfer transistor VT is turned on or off in response to the (n−1)th scan signal Scan[n−1] applied via the (n−1)th scan line SCAN[n−1].

In the third embodiment, enough time will be given for the first initial period INI and the sampling and second initial period SAM by configuring signals in such a way that the logic-low voltage part of at least 1 horizontal time 1H overlaps between the previous scan signal and the current scan signal. Therefore, the nth voltage transfer part VRD may comprise a single voltage transfer transistor VT by configuring the (n−1)th scan line SCAN[n−1] and the nth scan line SCAN[n] in such a way that their logic-low voltage parts overlap.

An nth subpixel SP comprises first to third transistors T1 to T3, fifth to seventh transistors T5 to T7, a driving transistor DT, a capacitor Cst, and an organic light-emitting diode OLED. The nth subpixel SP according to the third embodiment does not comprise the fourth transistor T4, as opposed to that of the second embodiment.

In the nth subpixel SP according to the third embodiment, unlike the first embodiment, the driving transistor DT is diode-connected and, at the same time, the organic light-emitting diode OLED is initialized. Specifically, in response to the (n−1)th scan signal Scan[n−1], the driving transistor DT is diode-connected, and the organic light-emitting diode OLED is initialized. Moreover, the fifth transistor T5 is turned on in response to the (n+1)th emission control signal Em[n+1] and transfers a drive current generated through the driving transistor DT to the organic light-emitting diode OLED. The configuration and connections of the nth subpixel SP according to the third embodiment of the present disclosure will be described below.

The first transistor T1 has a gate connected to the nth scan line SCAN[n], a first electrode connected to the mth data line DLm, and a second electrode connected to a first electrode of the second transistor T2 and a first electrode of the driving transistor DT. The first transistor T1 is turned on in response to the logic-low voltage VL of the nth scan signal Scan[n] applied via the nth scan line SCAN[n]. When the first transistor T1 is turned on, a data voltage applied via the mth data line DLm is stored in the second electrode of the first transistor T1.

The second transistor T2 has a gate connected to the nth emission control signal line EM[n], a first electrode connected to the second electrode of the first transistor T1, and a second electrode connected to the first power supply line EVDD and a first electrode of the seventh transistor T7. The second transistor T2 is turned on in response to the logic-low voltage VL of the nth emission control signal Em[n] applied via the nth emission control signal line EM[n]. When the second transistor T2 is turned on, a data voltage stored in the second electrode of the first transistor T1 is transferred to one electrode of the capacitor Cst through the seventh transistor T7.

The third transistor T3 has a gate connected to the (n−1)th scan line SCAN[n−1], a first electrode connected to a second electrode of the driving transistor DT, and a second electrode connected to a gate of the driving transistor DT. The third transistor T3 is turned on in response to the logic-low voltage VL of the (n−1)th scan signal Scan[n−1] applied via the (n−1)th scan line SCAN[n−1]. When the third transistor T3 is turned on, the driving transistor DT is diode-connected.

The fifth transistor T5 has a gate connected to the (n+1)th emission control signal line EM[n+1], a first electrode connected to the second electrode of the driving transistor DT, and a second electrode connected to the anode of the organic light-emitting diode OLED. The fifth transistor T5 is turned on in response to the logic-low voltage VL of the (n+1)th emission control signal Em[n+1] applied via the (n+1)th emission control signal line EM[n+1]. When the fifth transistor T5 is turned on, the organic light-emitting diode OLED emits light in response to a drive current generated through the driving transistor DT.

The sixth transistor T6 has a gate connected to the (n−1)th scan line SCAN[n−1], a first electrode connected to the initial line VINI, and a second electrode connected to the second electrode of the driving transistor DT and the anode of the organic light-emitting diode OLED. The sixth transistor T6 is turned on in response to the logic-low voltage of the (n−1)th scan signal Scan[n−1] applied via the (n−1)th scan line SCAN[n−1]. When the sixth transistor T6 is turned on, the anode of the organic light-emitting diode OLED is initialized based on the initial voltage Vini.

The seventh transistor T7 has a gate connected to the nth emission control signal line EM[n], a first electrode connected to the first power supply line EVDD and the second electrode of the second transistor T2, and a second electrode connected to one electrode of the capacitor Cst. The seventh transistor T7 is turned on in response to the logic-low voltage VL of the nth emission control signal Em[n] applied via the nth emission control signal line EM[n]. When the seventh transistor T7 is turned on, a data voltage stored in the second electrode of the first transistor T1 is transferred to the one electrode of the capacitor Cst through the second transistor T2.

One electrode of the capacitor Cst is connected to the second electrode of the seventh transistor T7, and the other electrode is connected to the second electrode of the fourth transistor T4. A node provided at the second electrode of the seventh transistor T7 and the one electrode of the capacitor Cst is defined as a voltage transfer node VDN which transfers the reference voltage. The anode of the organic light-emitting diode OLED is connected to the second electrode of the fifth transistor T5, and the cathode thereof is connected to the second power supply line EVSS.

The Nth subpixel SP according to the third embodiment operates in a sequence of an initial and sampling period INI & SAM, a holding period HLD, and an emission period EMI. The initial and sampling period INI and SAM is a period in which the organic light-emitting diode OLED is initialized and the threshold voltage of the driving transistor DT is sampled. The holding period HLD is a period in which a data voltage applied via the mth data line DLm is held in a particular node. The emission period EMI is a period in which the organic light-emitting diode OLED emits light by a drive current generated based on the data voltage. The emission period EMI occurs not by the nth emission signal Em[n] but by the (n+1)th emission signal Em[n+1].

In the case that the nth subpixel SP is driven in such a way that the previous scan signal and the current scan signal overlap as in the third embodiment, the emission control signal may be applied longer than 3 horizontal times, e.g., up to 4 horizontal times, and then emit light based on the next emission control signal. That is, if the nth subpixel SP, which is at the current stage, emits light based on the (n+1)th emission control signal Em[n+1], which is the next emission control signal, this means that a signal for forming the emission period EMI may be selected freely. This method has the advantage of avoiding space limitations when designing or changing the layout of subpixels (because the degree of freedom for the arrangement of signal lines is high).

For the nth subpixel SP according to the third embodiment, internal circuit-based compensation is done as the initial and sampling period INI & SAM occurs while the nth emission control signal Em[n] is not applied (the logic-high voltage is maintained). The operating characteristics during these periods will be described below in brief. By way of example, the low-logic voltage is applied in response to the (n−1)th scan signal Scan[n−1] and the nth scan signal Scan[n] during 2 horizontal times 2H, and the two signals overlap during 1 horizontal time 1H.

During the initial and sampling period INI & SAM, the third transistor T3 and the sixth transistor T6 are simultaneously turned on in response to the logic-low voltage VL of the (n−1)th scan signal Scan[n−1] applied via the (n−1)th scan line SCAN[n−1]. By the turn-on of the third transistor T3 and sixth transistor T6, the threshold voltage of the driving transistor DT is sampled, and the organic light-emitting diode OLED is initialized based on the initial voltage.

The nth subpixel SP according to the third embodiment is supplied with the reference voltage from the Nth voltage transfer part VRD during the initial and sampling period INI & SAM so that voltage drops in the first power supply voltage are taken into consideration. Accordingly, for the nth subpixel according to the third embodiment as well, voltage drops in the first power supply voltage applied via the first power supply line EVDD may be compensated for by the reference voltage applied during the initial and sampling period INI & SAM.

Therefore, the second embodiment may offer the same benefit as the first embodiment since the nth voltage transfer part VRD is capable of applying the reference voltage during the initial and sampling period INI & SAM. Moreover, in the third embodiment, power supply can be prevented from being cut off when the reference voltage is transferred, or the nodes can be prevented from electrically floating. Moreover, in the third embodiment, the nth voltage transfer part VRD comprises a single voltage transfer transistor VT, thereby simplifying the circuits enough to further reduce the non-display area (or bezel area) of the display panel. In addition, the third embodiment can overcome space limitations when designing or changing the layout of subpixels because the degree of freedom for the arrangement of signal lines is high.

As seen above, the present specification can solve or improve picture quality issues such as vertical luminance non-uniformity or crosstalk on the display panel by compensating for time-varying characteristics, with voltage drops on voltage supply lines taken into consideration. Moreover, the present specification can reduce the number of electrodes in each subpixel or the number of contacts on a wire by placing circuits for transferring reference voltage to the subpixels, and also can offer advantages in high integration, thereby preventing a decrease in aperture ratio when making a large-screen or high-resolution display panel.

Figure 21:
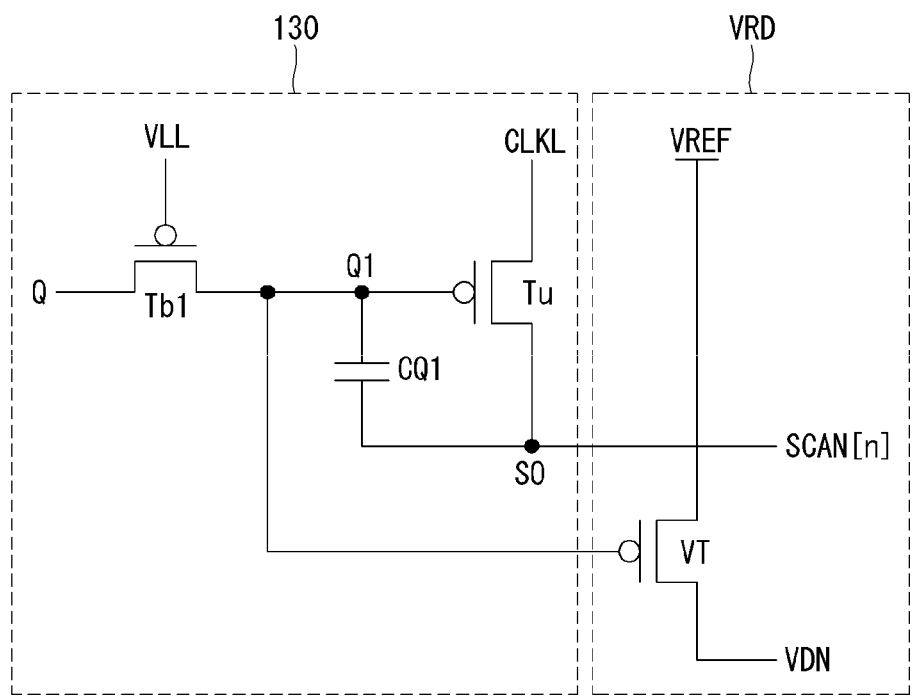
FIG. 21 is a circuit diagram showing the configuration of a voltage transfer part and a gate driver according to a first modification of one of the first to third embodiments of the present disclosure.

FIG. 21 is a circuit diagram showing the configuration of a voltage transfer part and a gate driver according to a first modification of one of the first to third embodiments of the present specification.

The nth voltage transfer part VRD according to the first modification of the present disclosure may comprise a single voltage transfer transistor VT. The voltage transfer transistor VT may be controlled by being connected to a component of the gate driver 130. The gate driver illustrated in FIG. 21 illustrates only some of the components for explaining the connections of the voltage transfer transistor VT.

The gate driver 130 comprises a pull-up transistor Tu, a first boosting capacitor CQ1, and a first auxiliary transistor Tb1. The pull-up transistor Tu outputs a gate-on voltage to the nth scan line SCAN[n] via a scan output node SO. If a transistor connected to the nth scan line SCAN[n] is a p-type transistor, the gate-on voltage is the logic-low voltage, and if a transistor connected to the nth scan line SCAN[n] is an n-type transistor, the gate-on voltage is the logic-high voltage.

The pull-up transistor Tu has a Q1 node Q1, a first electrode connected to a clock signal line CLKL providing clock signals, and a second electrode connected to the scan output node SO. The pull-up transistor Tu is turned on in response to the logic-low voltage input into the Q1 node Q1 and applies clock signals to the scan output node SO.

One electrode of the first boosting capacitor CQ1 is connected to the gate of the pull-up transistor Tu, and the other electrode is connected to the second electrode of the pull-up transistor Tu and the scan output node SO. The first boosting capacitor CQ1 allows the pull-up transistor Tu to stably apply the gate-on voltage to the scan output node SO by boosting the gate of the pull-up transistor Tu when the pull-up transistor Tu is turned on.

The first auxiliary transistor Tb1 has a gate connected to a logic-low voltage line VLL via which the logic-low voltage is applied, a first electrode connected to the Q1 node Q1, and a second electrode connected to the Q node Q. The first auxiliary transistor Tb1 is always kept turned on since the logic-low voltage is applied to its gate, thereby preventing voltage changes at the Q1 node Q1 from affecting other transistors connected to the Q node Q.

The voltage transfer transistor VT has a gate connected to the Q1 node Q1, a first electrode connected to the reference voltage line VREF, and a second electrode connected to the voltage transfer node VDN. The voltage transfer transistor VT is turned on in response to the logic-low voltage applied to the Q1 node Q1. In this case, the reference voltage is applied to the voltage transfer node VDN while the pull-up transistor Tu is turned on by the logic-low voltage applied to the Q node Q. Also, the reference voltage is applied to the voltage transfer node VDN while the logic-low voltage is applied to the nth scan line SCAN[n].

Fourth Embodiment

Figure 22:
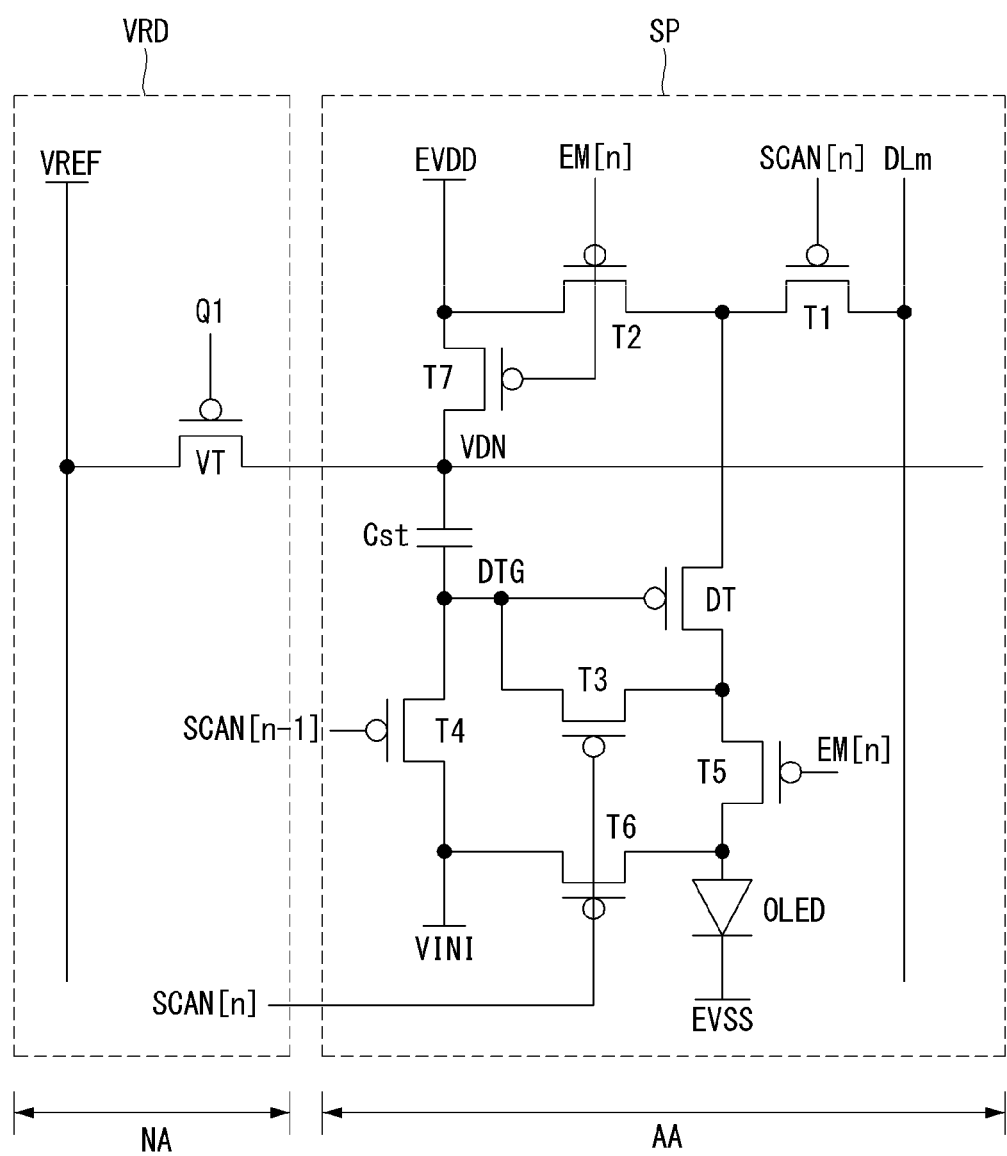
FIG. 22 is a circuit diagram showing a voltage transfer part and a subpixel according to a fourth embodiment of the present disclosure.

FIG. 22 is a circuit diagram showing a voltage transfer part and a subpixel according to a fourth embodiment of the present disclosure.

The nth voltage transfer part VRD according to the fourth embodiment may comprise a voltage transfer transistor VT, as illustrated in FIG. 6. FIG. 22 illustrates the connections between the voltage transfer part VRD and the subpixel SP. Moreover, the components of the subpixels SPs are identical to the components of the subpixels SPs explained in FIG. 6 may be omitted or explained briefly.

The voltage transfer transistor VT has a gate connected to the Q1 node Q1, a first electrode connected to the reference voltage line VREF, and a second electrode connected to the voltage transfer node VDN. The voltage transfer transistor VT is turned on in response to the logic-low voltage applied to the Q1 node Q1 and applies the reference voltage to the voltage transfer node VDN.

Figure 23A:
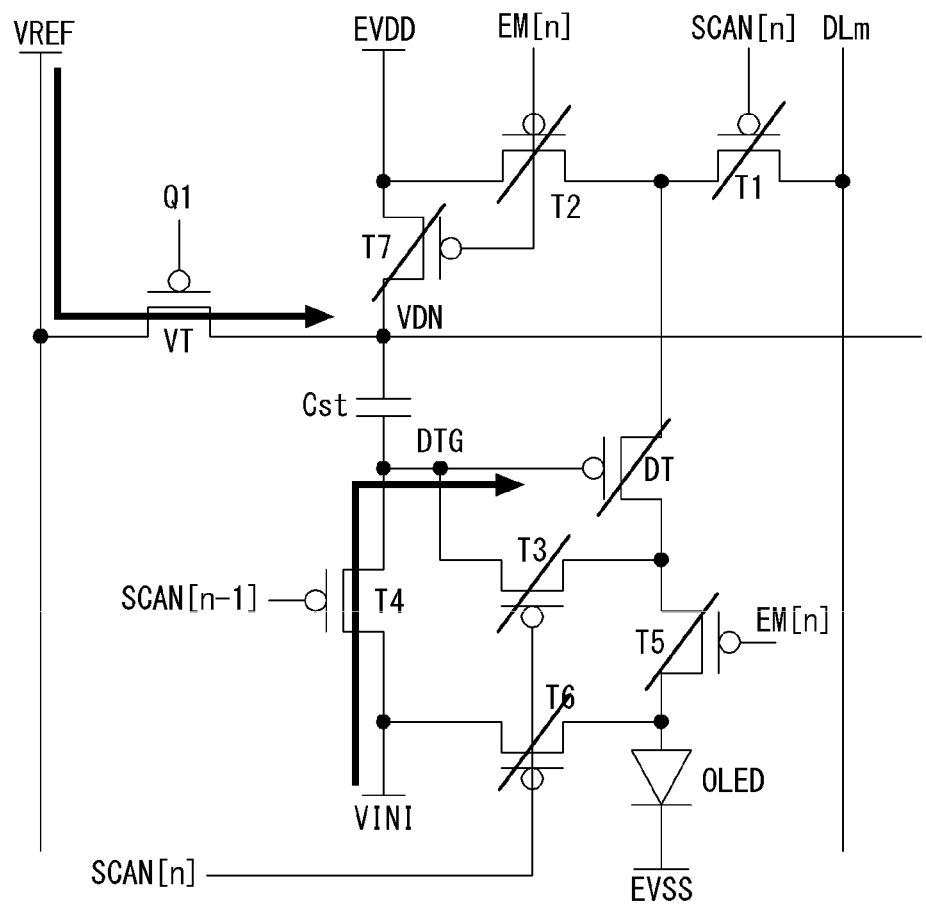
FIG. 23A is a view showing an operation during a first initial period of FIG. 22.
Figure 24A:
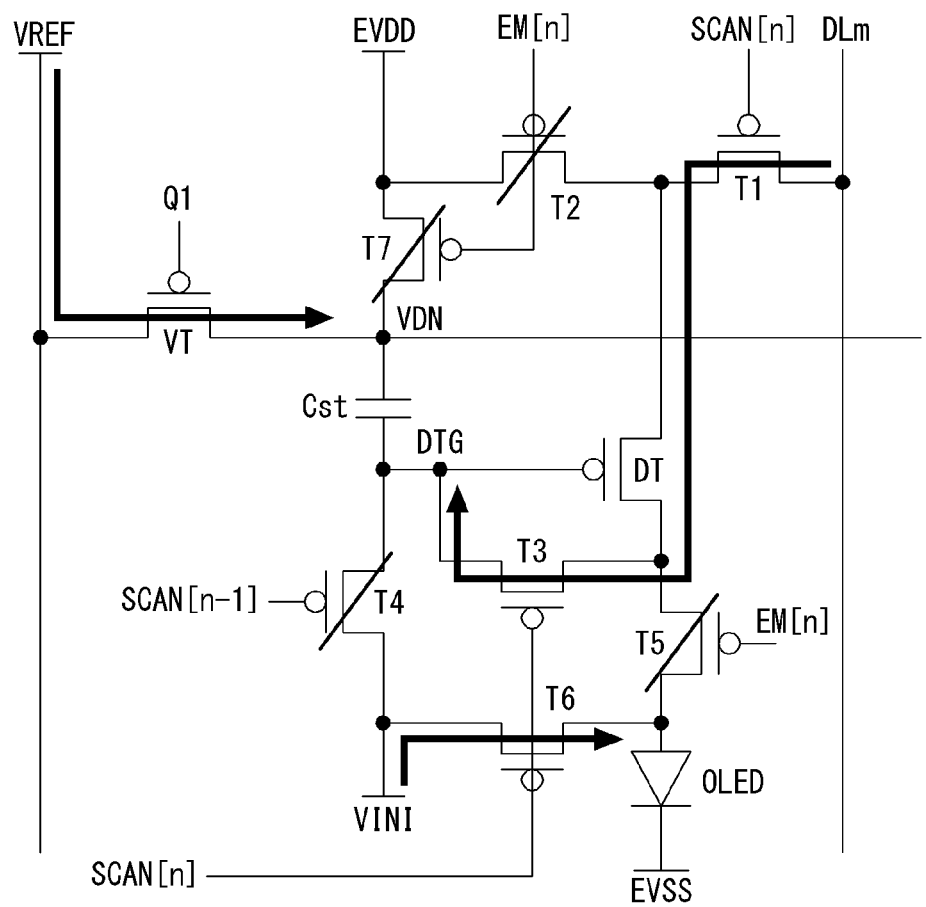
FIG. 24A is a view showing an operation during a sampling and second initial period of FIG. 22.
Figure 24B:
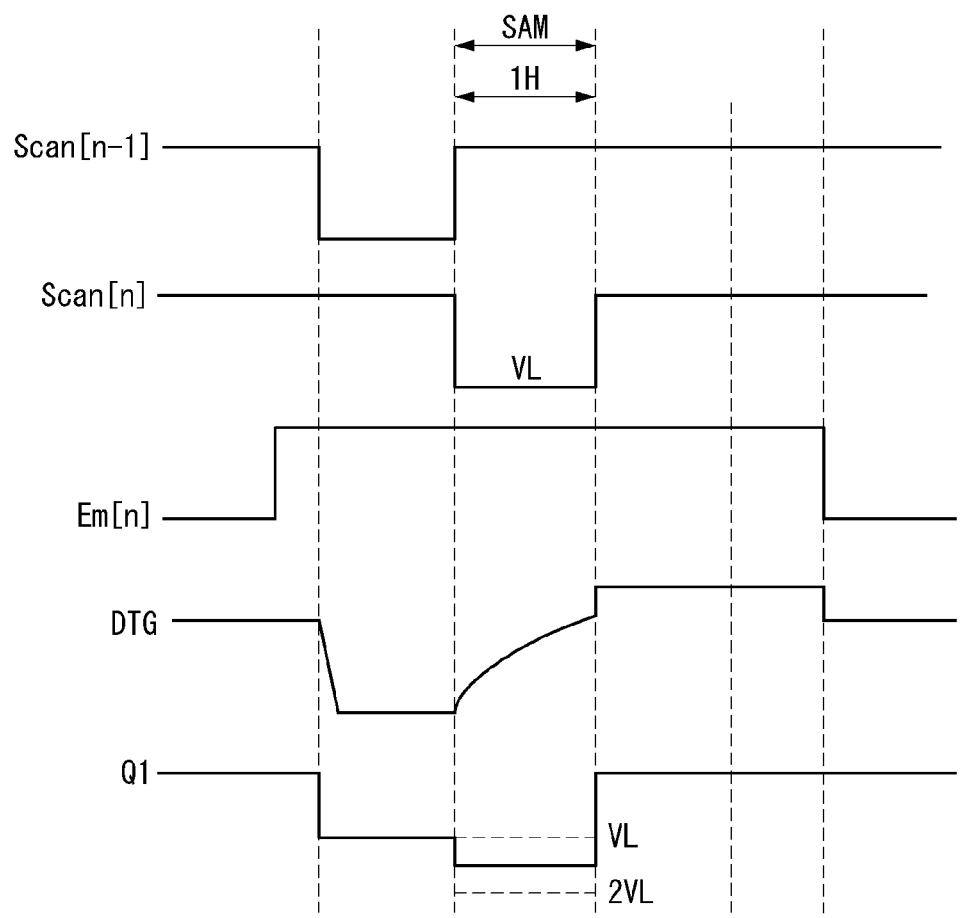
FIG. 24B is a waveform diagram showing the operation of FIG. 24A.
Figure 25A:
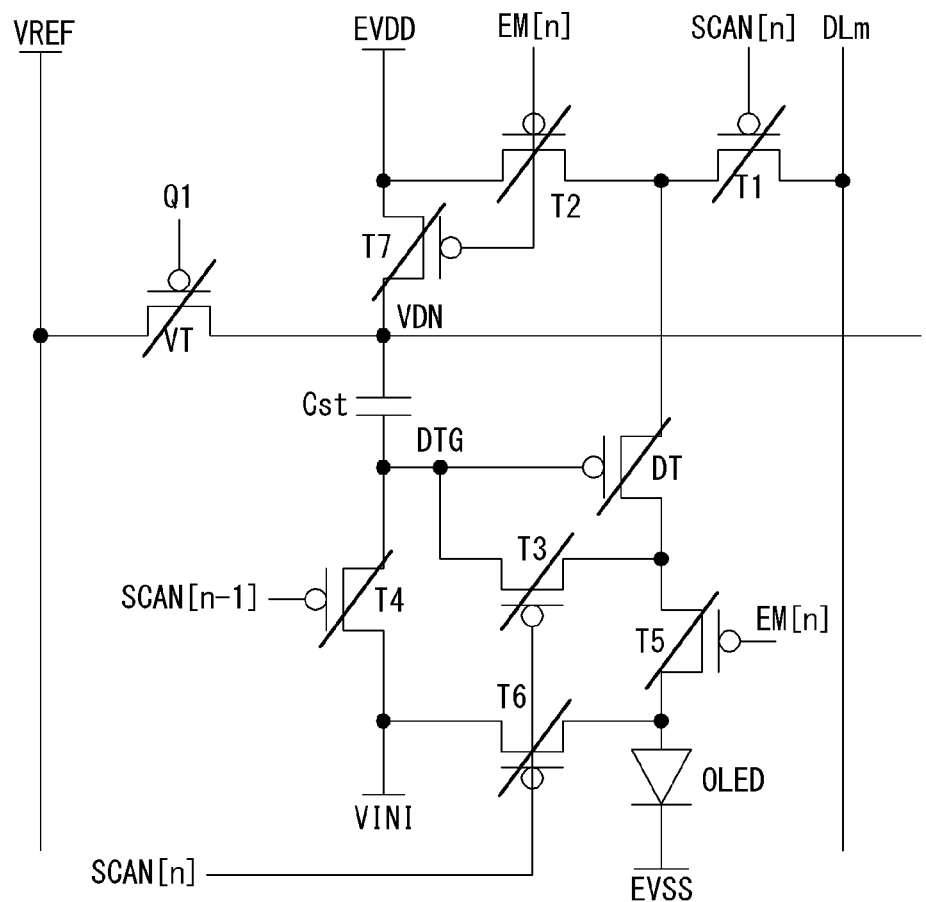
FIG. 25A is a view showing an operation during a holding period of FIG. 22.
Figure 25B:
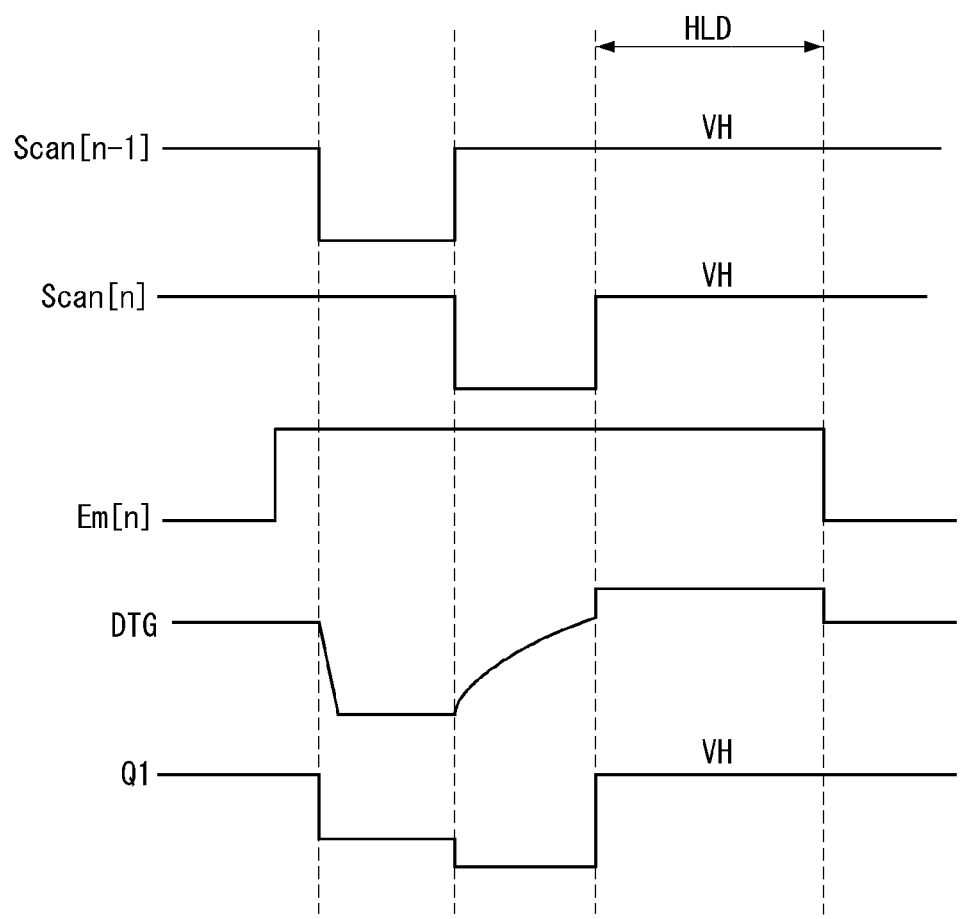
FIG. 25B is a waveform diagram showing the operation of FIG. 25A.
Figure 26A:
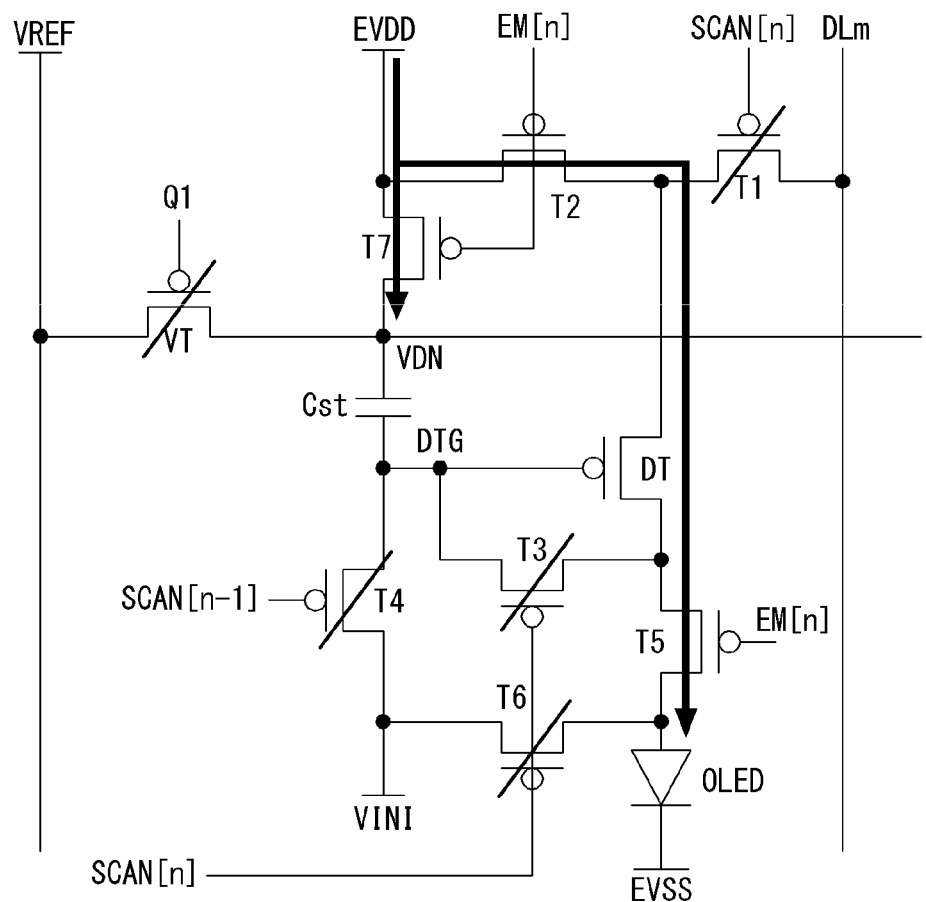
FIG. 26A is a view showing an operation during an emission period of FIG. 22.
Figure 26B:
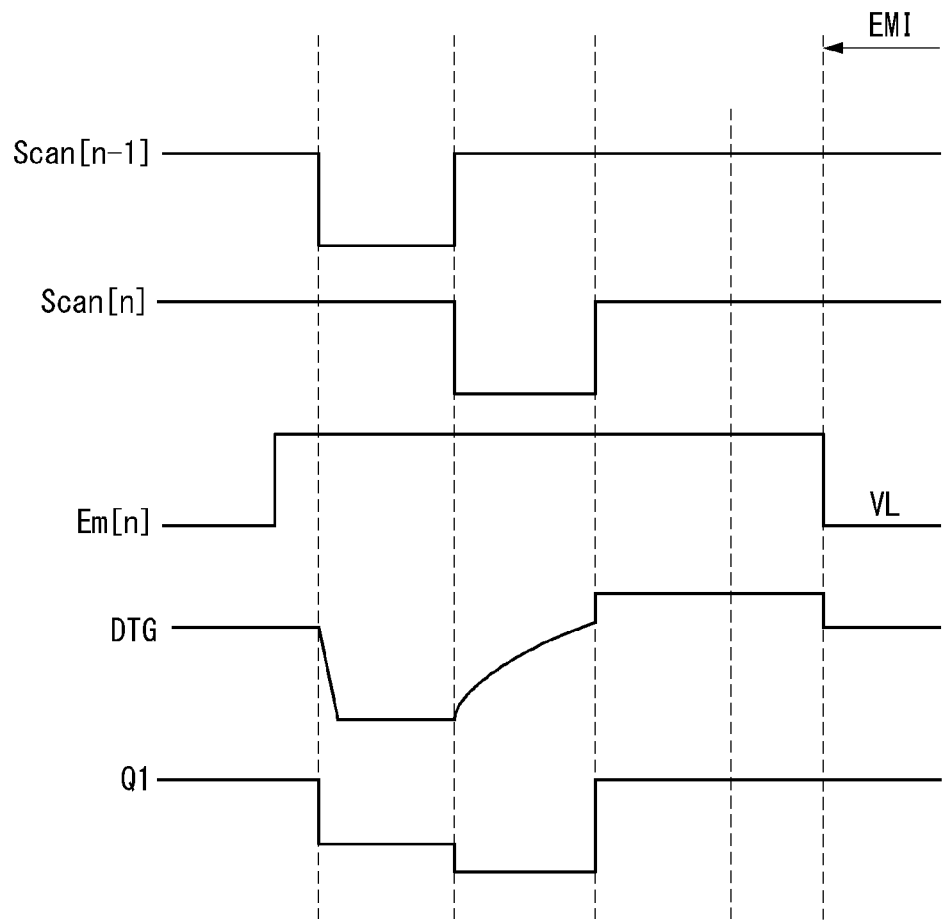
FIG. 26B is a waveform diagram showing the operation of FIG. 26A.

FIGS. 23A to 26B are views showing operations and waveforms of FIG. 22. FIG. 23A is a view showing an operation during a first initial period of FIG. 22. FIG. 23B is a waveform diagram showing the operation of FIG. 23A. FIG. 24A is a view showing an operation during a sampling and second period of FIG. 22. FIG. 24B is a waveform diagram showing the operation of FIG. 24A. FIG. 25A is a view showing an operation during a holding period of FIG. 22. FIG. 25B is a waveform diagram showing the operation of FIG. 25A. FIG. 26A is a view showing an operation during an emission period of FIG. 22. FIG. 26B is a waveform diagram showing the operation of FIG. 26A.

Figure 23B:
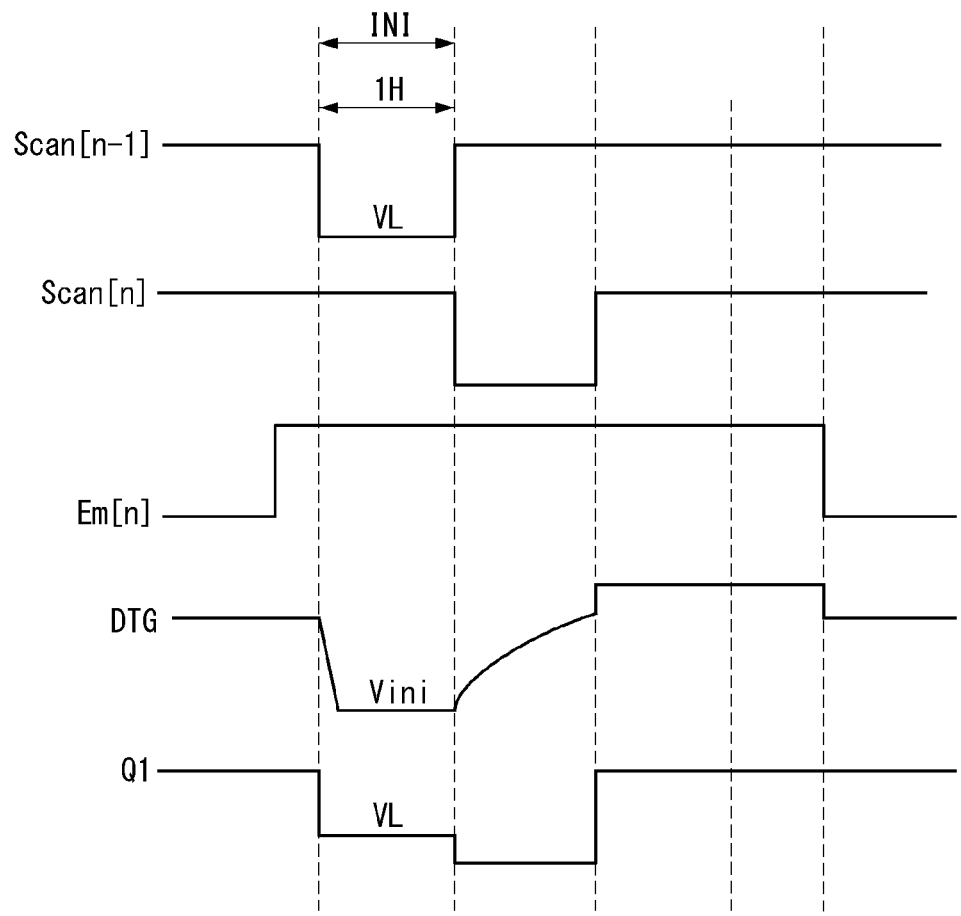
FIG. 23B is a waveform diagram showing the operation of FIG. 23A.

Referring to FIGS. 23A and 23B, the fourth transistor T4 is turned on in response to the logic-low voltage VL applied via the (n−1)th scan line SCAN[n−1] during the first initial period INI. Since the initial voltage Vini is applied to the gate DTG of the driving transistor DT through the turned-on fourth transistor T4, the gate node DTG of the driving transistor DT is initialized to the initial voltage Vini. Moreover, the voltage transfer transistor VT is turned on in response to the logic-low voltage VL applied to the Q1 node Q1 during the first initial period INI. The reference voltage is applied to the voltage transfer node VDN through the turned-on voltage transfer transistor VT.

Referring to FIGS. 24A and 24B, the first transistor T1, third transistor T3, driving transistor DT, and sixth transistor T6 are turned on in response to the logic-low voltage VL applied via the nth scan line SCAN[n] during the sampling and second initial period SAM. The gate and drain electrode of the driving transistor are connected together by the turned-on third transistor T3, and a data voltage Vdata is applied to the source electrode of the driving transistor DT through the turned-on first transistor T1, thereby turning on the driving transistor DT. The voltage of the gate node DTG of the driving transistor DT rises up to the difference between the data voltage Vdata and the threshold voltage Vth of the driving transistor DT. Moreover, the Q1 node Q1 is boosted during the sampling and second initial period SAM to apply the logic-low voltage through the nth scan line SCAN[n], and therefore the voltage transfer transistor VT is turned on to apply the reference voltage to the voltage transfer node VDN. In this case, the boosted voltage of the Q1 node Q1 is lower than the logic-low voltage VL and higher than 2VL, which is twice as high as the logic-low voltage. Accordingly, the reference voltage Vref applied to one electrode of the capacitor and the difference Vdata-IVthI between the data voltage applied to the other electrode of the capacitor Cst are stored as a capacitance. Moreover, the sixth transistor T6 is turned on during the sampling and second initial period SAM to initial the anode of the organic light-emitting diode OLED to the initial voltage Vini.

As can be seen from FIGS. 24A and 24B, the voltage transfer transistor is turned on during the first initial period in response to the logic-low voltage of the (n−1)th scan signal for driving the (N−1)th subpixels of the (n−1)th scan line and during the sampling and second initial period in response to the nth scan signal for driving the nth subpixels of the Nth scan line, thereby applying the reference voltage to the subpixels. Accordingly, the subpixels applied with the reference voltage supplies the organic light-emitting diodes with a drive current not affected by the first power supply voltage, thereby improving the problem of the picture quality of the electroluminescence display.

Referring to FIGS. 25A and 25B, the logic-high voltage VH is applied to the Q1 node during the holding period HLD to thereby turn off the voltage transfer transistor VT. Moreover, the (n−1)th scan signal Scan[n−1] and the nth scan signal Scan[n] are the logic-high voltage VH, which causes all transistors constituting the subpixel to be turned off. The holding period HLD varies with the cycle of clock signals from an emission driver outputting the nth emission control signal Em[n] and the cycle of clock signals from the gate driver outputting the Nth scan signal Scan[n]. For example, the holding period HLD may be longer than 1 horizontal time 1H. During the holding period HLD, the capacitor Cst stores and maintains a data voltage based on the voltage difference between the two ends. As the nth scan signal Scan[n] is switched from the logic-low voltage to the logic-high voltage during the holding period HLD, the voltage of the gate node DTG of the driving transistor DT may be slightly varied by a parasitic capacitor of the third transistor T3.

Referring to FIGS. 26A and 26B, the second transistor T2, seventh transistor T7, and fifth transistor T5 are turned on in response to the logic-low voltage VL of the nth emission control signal Em[n] applied via the nth emission control signal line EM[n] during the emission period EMI. The first power supply voltage VDD is applied to one electrode of the capacitor Cst through the turned-on seventh transistor T7. The first power supply voltage VDD is applied to the first electrode of the driving transistor DT through the turned-on second transistor T2, and the fifth transistor T5 is turned on, thereby turning on the driving transistor DT. The turned-on driving transistor DT provides a drive current to the anode of the organic light-emitting diode, thereby causing the organic light-emitting diode to emit light. In this case, the voltage applied to one electrode of the capacitor Cst is varied, so the voltage of the other electrode of the capacitor Cst is also varied due to coupling. The drive current provided to the anode of the organic light-emitting diode OLED is the same as represented by the equation mentioned with respect to FIG. 3.

According to the fourth embodiment of the present specification, the voltage transfer transistor VT for applying the reference voltage may be disposed at one electrode of the capacitor Cst. Therefore, a drive circuit for compensating for time-varying characteristics (or variation with time) may be implemented, with drops in power-supply voltage taken into consideration, and this can solve picture quality problems such as vertical luminance non-uniformity or crosstalk on the display panel.

Figure 27:
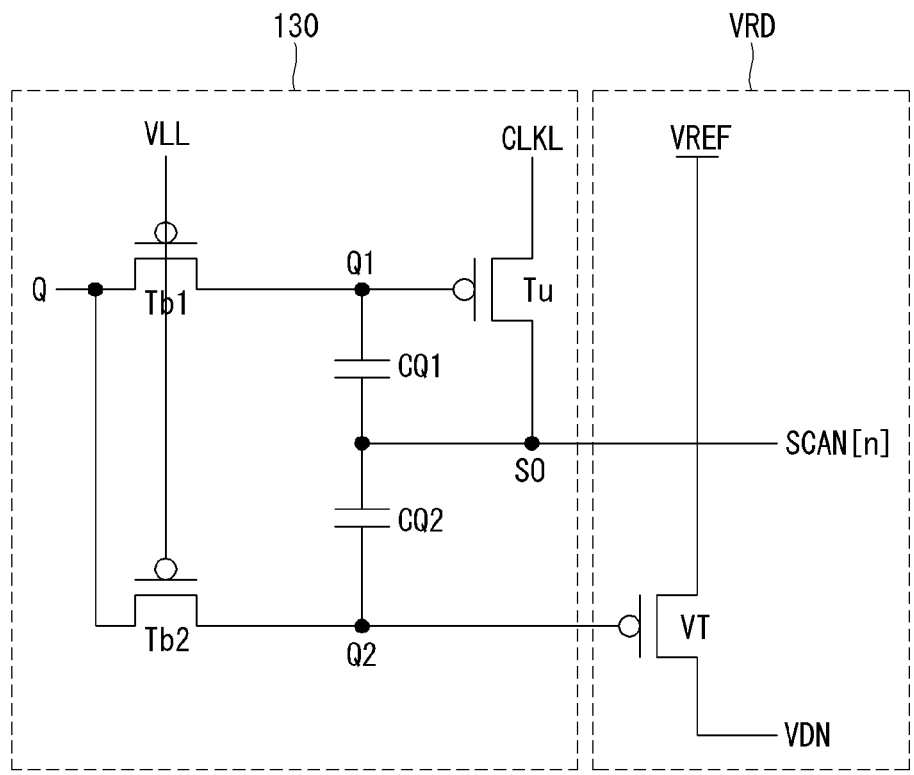
FIG. 27 is a circuit diagram showing the configuration of a voltage transfer part and a gate driver according to a second modification of one of the first to fourth embodiments of the present disclosure.

FIG. 27 is a circuit diagram showing the configuration of a voltage transfer part and a gate driver according to a second modification of one of the first to fourth embodiments of the present specification. FIG. 27 shows a modification of the connections of the voltage transfer part due to an alteration to the configuration of the gate driver 130 of FIG. 21, so any redundancies will be omitted or explained briefly.

The nth voltage transfer part VRD according to the second modification of the present disclosure may comprise a single voltage transfer transistor VT. The voltage transfer transistor VT may be controlled by being connected to a component of the gate driver 130. The gate driver illustrated in FIG. 27 illustrates only some of the components for explaining the connections of the voltage transfer transistor VT.

Referring to FIG. 27, the gate driver 130 comprises a pull-up transistor Tu, a first boosting capacitor CQ1, a second boosting capacitor CQ2, a first auxiliary transistor Tb1, and a second auxiliary transistor Tb2. The pull-up transistor Tu outputs a gate-on voltage to the nth scan line SCAN[n] via a scan output node SO.

The pull-up transistor Tu has a Q1 node Q1, a first electrode connected to a clock signal line CLKL providing clock signals, and a second electrode connected to the scan output node SO. The pull-up transistor Tu is turned on in response to the logic-low voltage input into the Q1 node Q1 and applies clock signals to the scan output node SO.

One electrode of the first boosting capacitor CQ1 is connected to the gate of the pull-up transistor Tu, and the other electrode is connected to the second electrode of the pull-up transistor Tu and the scan output node SO. The first boosting capacitor CQ1 allows the pull-up transistor Tu to stably apply the gate-on voltage to the scan output node SO by boosting the gate of the pull-up transistor Tu when the pull-up transistor Tu is turned on.

One electrode of the second boosting capacitor CQ2 is connected to the other electrode of the first bosting capacitor CQ1, and the other electrode is connected to a Q2 node Q2 and the gate of the voltage transfer transistor VT. According to the second modification of the present specification, the gate of the voltage transfer transistor VT is connected to the Q1 node Q1, and the Q1 node Q1 forms a parasitic capacitance as well as the capacitance caused by the first boosting capacitor CQ1. Due to the parasitic capacitance caused by the voltage transfer transistor VT, the boosting efficiency of the Q1 node Q1 may be decreased. According to the second embodiment of the present specification, the gate of the voltage transfer transistor VT may be separated from the Q1 node Q by using the second boosting capacitor CQ2 in the gate driver 130, thereby preventing a decrease in the boosting efficiency of the Q1 node Q1.

The first auxiliary transistor Tb1 has a gate connected to a logic-low voltage line VLL via which the logic-low voltage is applied, a first electrode connected to the Q1 node Q1, and a second electrode connected to the Q node Q. The first auxiliary transistor Tb1 is always kept turned on since the logic-low voltage is applied to its gate, thereby preventing voltage changes at the Q1 node Q1 from affecting other transistors connected to the Q node Q.

The second auxiliary transistor Tb2 has a gate connected to the logic-low voltage line VLL via which the logic-low voltage is applied, a first electrode connected to the Q2 node Q2, and a second electrode connected to the Q node Q. The second auxiliary transistor Tb2 is always kept turned on since the logic-low voltage is applied to its gate, thereby preventing voltage changes at the Q2 node Q2 from affecting other transistors connected to the Q node Q. The second auxiliary transistor Tb2 separates the gate of the voltage transfer transistor VT form the Q1 node Q1, along with the second boosting capacitor CQ2.

The voltage transfer transistor VT has a gate connected to the Q2 node Q2, a first electrode connected to the reference voltage line VREF, and a second electrode connected to the voltage transfer node VDN. The voltage transfer transistor VT is turned on in response to the logic-low voltage applied to the Q2 node Q2. In this case, the reference voltage is applied to the voltage transfer node VDN while the pull-up transistor Tu is turned on by the logic-low voltage applied to the Q node Q. Also, the reference voltage is applied to the voltage transfer node VDN while the logic-low voltage is applied to the nth scan line SCAN[n].

Fifth Embodiment

Figure 28:
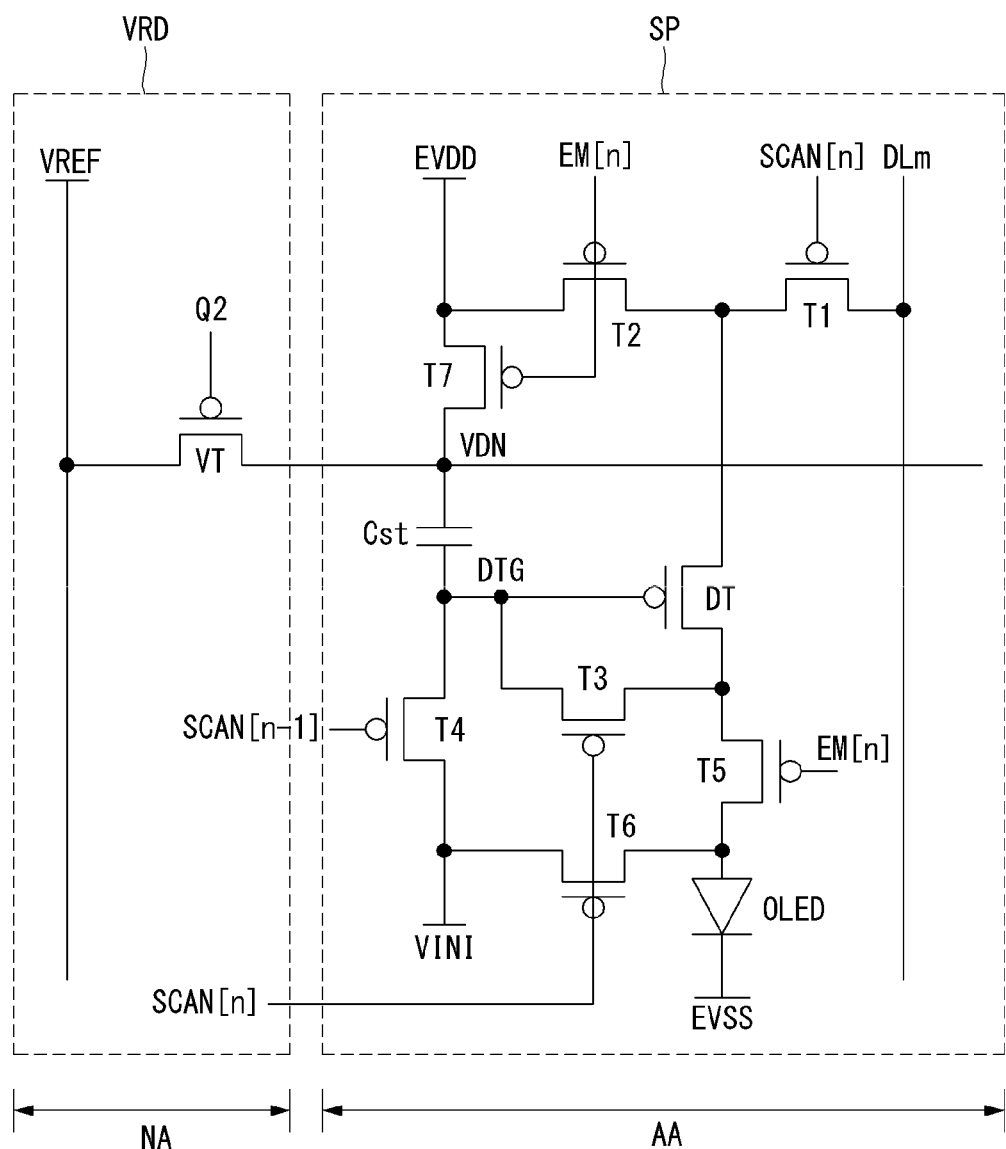
FIG. 28 is a circuit diagram showing a voltage transfer part and a subpixel according to a fifth embodiment of the present disclosure.

FIG. 28 is a circuit diagram showing a voltage transfer part and a subpixel according to a fifth embodiment of the present disclosure.

The nth voltage transfer part VRD according to the fifth embodiment may comprise a voltage transfer transistor VT, as illustrated in FIG. 27. FIG. 28 illustrates the connections between the voltage transfer part VRD and the subpixel SP. Moreover, the components of the subpixels SPs are identical to the components of the subpixels SPs explained in FIG. 6 may be omitted or explained briefly.

The voltage transfer transistor VT has a gate connected to the Q2 node Q2, a first electrode connected to the reference voltage line VREF, and a second electrode connected to the voltage transfer node VDN. The voltage transfer transistor VT is turned on in response to the logic-low voltage applied to the Q2 node Q2 and applies the reference voltage to the voltage transfer node VDN.

Figure 29:
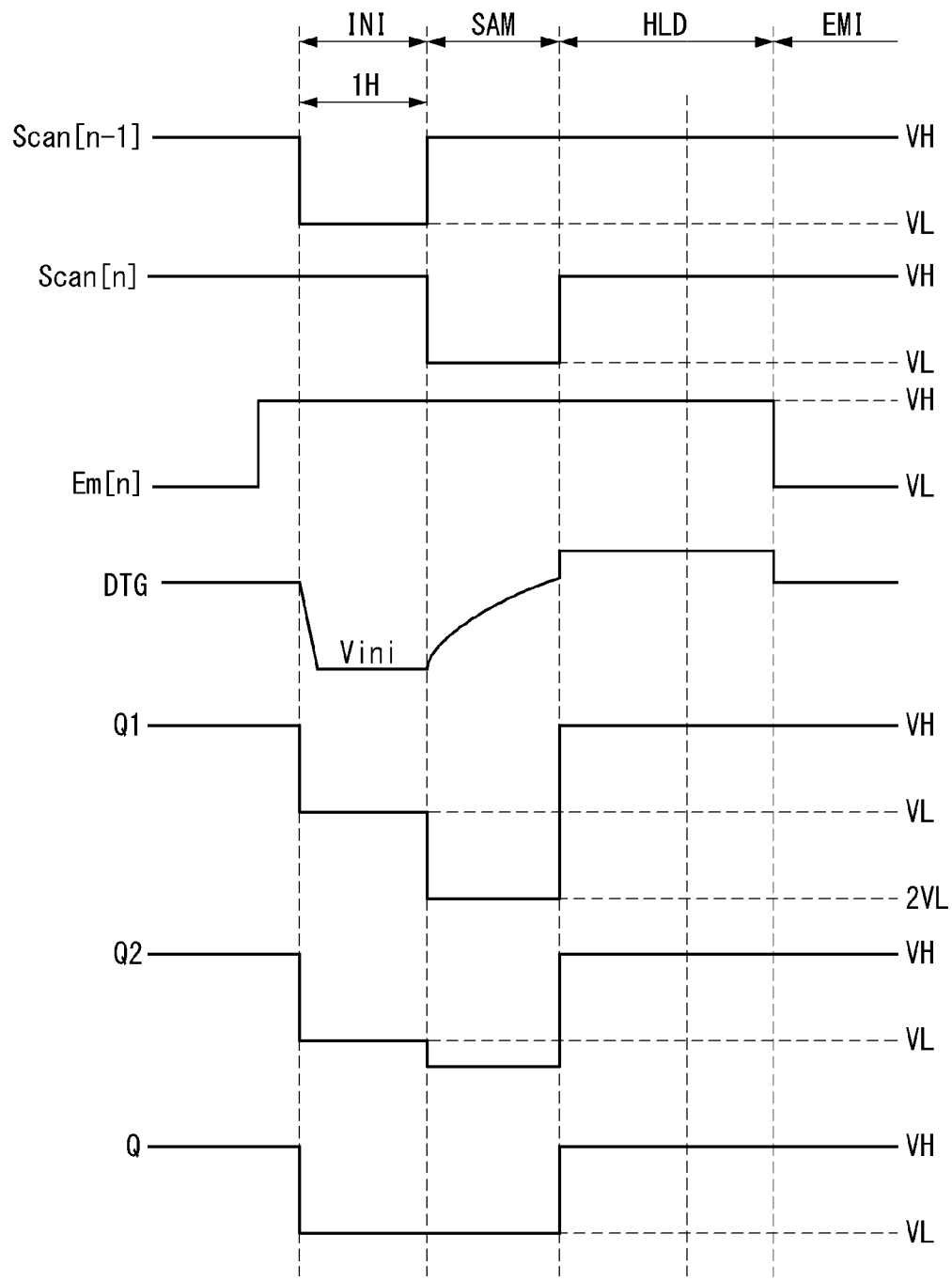
FIG. 29 is a waveform diagram showing an operation of FIG. 28.

FIG. 29 is a view showing an operation of FIG. 28.

The nth subpixel SP operates in a sequence of a first initial period INI, a sampling and second initial period SAM, a holding period HLD, and an emission period EMI. The operations of the subpixel SP in the respective phases are identical to those shown in FIGS. 23A, 24A, 25A, and 26A according to the first embodiment of the present disclosure, so any redundancies will be omitted or explained briefly.

During the first initial period INI, the gate node DTG of the driving transistor DT is initial to the initial voltage Vini by the logic-low voltage VL of the (n−1)th scan signal Scan[n−1]. Also, the logic-low voltage VL is applied to the Q1 node Q1 and the Q2 node Q2 in response to the logic-low voltage VL applied to the Q node Q.

During the sampling and second initial period SAM, the voltage applied to the gate node DTG of the driving transistor DT by the logic-low voltage VL of the nth scan signal Scan[n] rises up to the difference between the data voltage and the threshold voltage of the driving transistor DT. Moreover, in the gate driver 130, the Q1 node Q1 is boosted by the first boosting capacitor CQ1, and the voltage of the Q1 node Q1 drops to 2VL which is lower than the logic-low voltage VL, thereby properly outputting the logic-low voltage VL to the nth scan line SCAN[n]. Accordingly, the efficiency of the gate driver 130 can be improved. In this case, the gate of the voltage transfer transistor VT, as well as the second boosting capacitor CQ2, is connected to the Q2 node Q2, thereby keeping the voltage of the Q2 node Q2 from dropping as much as the voltage at the Q1 node Q1 drops due to the parasitic capacitance of the voltage transfer transistor VT.

During the holding period HLD, the nth scan signal Scan[n], Q node Q, Q1 node Q1, and Q2 node may be switched to the logic-high voltage VH, and the (n−1)th scan signal Scan[n−1] and the nth emission control signal Em[n] may be kept at the logic-high voltage VH. In this case, the holding period HLD may be maintained for 1 horizontal time 1H or longer. Also, during the holding period HLD, the capacitor Cst stores and maintains a data voltage based on the voltage difference between the two ends. In this case, as the nth scan signal Scan[n] is switched from the logic-low voltage to the logic-high voltage, the voltage of the gate node DTG of the driving transistor DT may be slightly varied by a parasitic capacitor of the third transistor T3.

During the emission period EMI, the nth emission control signal Em[n] is switched to the logic-low voltage VL, and the driving transistor DT is turned on. The turned-on driving transistor DT provides a drive current to the anode of the organic light-emitting diode OLED, thereby causing the organic light-emitting diode OLED to emit light. The drive current provided to the anode of the organic light-emitting diode OLED is the same as represented by the equation mentioned with respect to FIG. 3.

According to the fifth embodiment of the present specification, the voltage transfer transistor VT for applying the reference voltage may be disposed at one electrode of the capacitor Cs, and the second boosting capacitor CQ2 and the second auxiliary transistor Tb2 may be disposed at the gate driver 130. Therefore, a drive circuit for compensating for time-varying characteristics (or variation with time) may be implemented, with drops in power-supply voltage taken into consideration, and this can solve picture quality problems such as vertical luminance non-uniformity or crosstalk on the display panel.

Although the voltage transfer part VRD according to the fourth and fifth embodiments of the present specification has been illustrated and explained separately from the gate driver 130, the present disclosure is not limited thereto and the voltage transfer part VRD may be included in the gate driver 130. Accordingly, the efficiency of the gate driver may be improved.

According to the embodiments of the present specification, a circuit for transferring a reference voltage to subpixels may be included in a non-display area, and this can simplify the pixel circuits and therefore offers advantages for high integration, thereby preventing a decrease in aperture ratio when making a large-screen or high-resolution display panel.

According to the embodiments of the present specification, a circuit for transferring a reference voltage to subpixels may be included in the gate driver, and this can improve the efficiency of the gate driver.

According to the embodiments of the present specification, a drive circuit for compensating for time-varying characteristics (or variation with time) may be implemented, with drops in power-supply voltage taken into consideration, and this can solve picture quality problems such as vertical luminance non-uniformity or crosstalk on the display panel.

An electroluminescent display device and a driving method of the electroluminescence display device according to various embodiments of the disclosure will be described as follows.

According to an aspect of the present disclosure, there is provided an electroluminescence display device comprising a display panel having a display area where images are displayed and a non-display area where images are not displayed, a subpixel located in the display area, and a voltage transfer part that is located in the non-display area and transfers a reference voltage to a voltage transfer node of the subpixel in response to a signal applied from outside the display panel or a signal generated on the display panel.

According to another aspect of the present disclosure, the display panel may comprise a plurality of scan lines, to each of which a plurality of subpixels are connected, and the voltage transfer part is provided on each scan line in the non-display area.

According to another aspect of the present disclosure, the voltage transfer part may operate to output the reference voltage during a sampling period for sampling the threshold voltage of a driving transistor of the subpixel.

According to another aspect of the present disclosure, the voltage transfer part may comprise at least one voltage transfer transistor that is turned on or off in response to an (n−1)th scan signal for driving (n−1)th subpixels on an (n−1)th scan line or an nth scan signal for driving nth subpixels on an nth scan line.

According to another aspect of the present disclosure, the first voltage transfer transistor may have a gate connected to the (n−1)th scan line, a first electrode connected to a reference voltage line for transferring the reference voltage, and a second electrode connected to the voltage transfer node included in the subpixel, and the second voltage transfer has a gate connected to the nth scan line, a first electrode connected to the reference voltage line, and a second electrode connected to the voltage transfer node.

According to another aspect of the present disclosure, the voltage transfer part may comprise a voltage transfer transistor that has a gate connected to the nth scan line, a first electrode connected to a reference voltage line for transferring the reference voltage, and a second electrode connected to the voltage transfer node.

According to another aspect of the present disclosure, the voltage transfer part may comprise a voltage transfer transistor that has a gate connected to the (n−1)th scan line, a first electrode connected to a reference voltage line for transferring the reference voltage, and a second electrode connected to the voltage transfer node.

According to another aspect of the present disclosure, the subpixel may comprise a first transistor that has a gate connected to an nth scan line and a first electrode connected to a first data line, a second transistor that has a gate connected to an nth emission control signal line, a first electrode connected to a second electrode of the first transistor, and a second electrode connected to a first power supply line, a driving transistor that has a gate connected to a gate node and a first electrode connected to the second electrode of the first transistor and the first electrode of the second transistor, a third transistor that has a gate connected to the nth scan line, a first electrode connected to a second electrode of the driving transistor, and a second electrode connected to the gate of the driving transistor, a fourth transistor that has a gate connected to an (n−1)th scan line, a first electrode connected to an initial line, and a second electrode connected to the second electrode of the third transistor and the gate of the driving transistor, a fifth transistor that has a gate connected to the nth emission control signal line and a first electrode connected to the second electrode of the driving transistor, a sixth transistor that has a gate connected to the nth scan line, a first electrode connected to the initial line, and a second electrode connected to a second electrode of the fifth transistor, a seventh transistor that has a gate connected to the nth emission control signal line, a first electrode connected to the first power supply line, and a second electrode connected to the voltage transfer node, a capacitor that has a first electrode connected to the voltage transfer node, and a second electrode connected to the gate of the driving transistor, and an organic light-emitting diode that has an anode connected to the second electrode of the fifth transistor and a cathode connected to a second power supply line.

According to another aspect of the present disclosure, the subpixel may comprise a first transistor that has a gate connected to an nth scan line and a first electrode connected to a first data line, a second transistor that has a gate connected to an nth emission control signal line, a first electrode connected to a second electrode of the first transistor, and a second electrode connected to a first power supply line, a driving transistor that has a gate connected to a gate node and a first electrode connected to the second electrode of the first transistor and the first electrode of the second transistor, a third transistor that has a gate connected to the nth scan line, a first electrode connected to a second electrode of the driving transistor, and a second electrode connected to the gate of the driving transistor, a fourth transistor that has a gate connected to an (n−1)th scan line, a first electrode connected to an initial line, and a second electrode connected to the second electrode of the third transistor and the gate of the driving transistor, a fifth transistor that has a gate connected to the nth emission control signal line and a first electrode connected to the second electrode of the driving transistor, a sixth transistor that has a gate connected to the (n−1)th scan line, a first electrode connected to the initial line, and a second electrode connected to the second electrode of the fifth transistor, a seventh transistor that has a gate connected to the nth emission control signal line, a first electrode connected to the first power supply line, and a second electrode connected to the voltage transfer node, a capacitor that has a first electrode connected to the voltage transfer node, and a second electrode connected to the gate of the driving transistor, and an organic light-emitting diode that has an anode connected to the second electrode of the fifth transistor and a cathode connected to a second power supply line.

According to another aspect of the present disclosure, the subpixel may comprise a first transistor that has a gate connected to an nth scan line and a first electrode connected to a first data line, a second transistor that has a gate connected to an nth emission control signal line, a first electrode connected to a second electrode of the first transistor, and a second electrode connected to a first power supply line, a driving transistor that has a gate connected to a gate node and a first electrode connected to the second electrode of the first transistor and the first electrode of the second transistor, a third transistor that has a gate connected to the (n−1)th scan line, a first electrode connected to a second electrode of the driving transistor, and a second electrode connected to the gate of the driving transistor, a fifth transistor that has a gate connected to the (n+1)th emission control signal line and a first electrode connected to the second electrode of the driving transistor, a sixth transistor that has a gate connected to the (n−1)th scan line, a first electrode connected to the initial line, and a second electrode connected to a second electrode of the fifth transistor, a seventh transistor that has a gate connected to the nth emission control signal line, a first electrode connected to the first power supply line, and a second electrode connected to the voltage transfer node, a capacitor that has a first electrode connected to the voltage transfer node, and a second electrode connected to the gate of the driving transistor, and an organic light-emitting diode that has an anode connected to the second electrode of the fifth transistor and a cathode connected to a second power supply line.

According to an aspect of the present disclosure, there is provided an electroluminescence display device comprising a display panel having a display area where images are displayed and a non-display area where images are not displayed, a subpixel located in the display area, and a voltage transfer part that is located in the non-display area and transfers a reference voltage to the subpixel. The method comprising an initial step for initializing the subpixel, and a sampling step for compensating for the threshold voltage of a driving transistor of the subpixel. Wherein, during the sampling step, the voltage transfer part operates in response to a signal applied from outside the display panel or a signal generated on the display panel.

According to another aspect of the present disclosure, the voltage transfer part may be turned on for a first period based on an (n−1)th scan signal for driving (n−1)th subpixels on an (n−1)th scan line, the voltage transfer part may be turned on during a second period subsequent to the first period based on an nth scan signal for driving nth subpixels on an nth scan line, and the reference voltage may be transferred to the nth subpixels during the first and second periods.

According to another aspect of the present disclosure, for the nth subpixels on the display panel, the initial step and the sampling step may be performed at different times based on an nth scan signal and an (n−1)th scan signal which overlap during at least 1 horizontal time.

According to another aspect of the present disclosure, the voltage transfer part may be turned on based on the nth scan signal for driving the nth subpixels so as to transfer the reference voltage to the nth subpixels.

According to another aspect of the present disclosure, for the nth subpixels on the display panel, the initial step and the sampling step may be performed simultaneously based on an nth scan signal and an (n−1)th scan signal which overlap during at least 1 horizontal time.

According to another aspect of the present disclosure, the voltage transfer part may be turned on based on the (n−1)th scan signal for driving the (n−1)th subpixels so as to transfer the reference voltage to the nth subpixels.

According to an aspect of the present disclosure, there is provided an electroluminescence display device comprising a display panel having a display area where images are displayed and a non-display area where images are not displayed, a subpixel located in the display area, a gate driver located in the non-display area, and a voltage transfer transistor that is located in the non-display area and transfers a reference voltage to the subpixel. And a gate of the voltage transfer transistor is connected to the gate driver.

According to another aspect of the present disclosure, the gate driver may comprise a pull-up transistor, and a first boosting capacitor connected to a gate of the pull-up transistor and a drain of the pull-up transistor. And the gate of the voltage transfer transistor may be connected to the gate of the pull-up transistor.

According to another aspect of the present disclosure, the gate driver may further comprise a first auxiliary transistor. And a gate of the first auxiliary transistor may be connected to a line via which a logic-low voltage is applied, and a first electrode of the first auxiliary transistor may be connected to the gate of the pull-up transistor.

According to another aspect of the present disclosure, the gate driver may comprise a pull-up transistor, a first boosting capacitor connected to a gate of the pull-up transistor and a drain of the pull-up transistor, and a second boosting capacitor whose one electrode may be connected to the drain of the pull-up transistor. And the gate of the pull-up transistor may be connected to the other electrode of the second boosting capacitor.

According to another aspect of the present disclosure, the gate driver may further comprise a first auxiliary transistor and a second auxiliary transistor. And a gate of the first auxiliary transistor and a gate of the second auxiliary transistor may be connected to a line via which a logic-low voltage is applied, a first electrode of the first auxiliary transistor may be connected to a gate of the pull-up transistor, a first electrode of the second auxiliary transistor may be connected to a gate of the voltage transfer transistor, and a second electrode of the first auxiliary transistor and a second electrode of the second auxiliary transistor may be connected to the same node.

According to another aspect of the present disclosure, a first electrode of the voltage transfer transistor may be connected to a line via which the reference voltage is applied, and a second electrode of the voltage transfer transistor may be connected to a voltage transfer node included in the subpixel.

According to an aspect of the present disclosure, there is provided a driving method of an electroluminescence display device comprising a display panel having a display area and a non-display area, a subpixel located in the display area and comprising an organic light-emitting diode, and a voltage transfer part located in the non-display area. The method comprising a first initial step for initializing a gate of a driving transistor included in the subpixel, a sampling and second initial step for compensating for the threshold voltage of the driving transistor and initializing an anode of the organic light-emitting diode. Wherein, during the first initial step and the sampling and second initial step, the voltage transfer part provides a reference voltage to the subpixel.

According to another aspect of the present disclosure, the voltage transfer part may be turned on in the first initial step in which an (n−1)th scan signal for driving subpixels connected to an (n−1)th scan line is a logic-low voltage and in the sampling and second initial step in which an nth scan signal for driving subpixels connected to an nth scan line is the logic-low voltage.

According to another aspect of the present disclosure, in the sampling and second initial step, the reference voltage applied through the voltage transfer part may be stored at one electrode of a capacitor included in the subpixel.

According to another aspect of the present disclosure, a logic-low voltage may be applied to the voltage transfer part in the first initial step, and a voltage lower than the logic-low voltage may be applied to the voltage transfer part in the sampling and second initial step.

What is claimed is:

1. An electroluminescence display device comprising:
    a display panel having a display area where images are displayed and a non-display area where images are not displayed;
    a subpixel located in the display area; and
    a voltage transfer circuit that is in the non-display area and transfers a reference voltage to a voltage transfer node of the subpixel, in response to a signal applied from outside the display panel or a signal generated on the display panel,
    wherein the subpixel comprises:
    a driving transistor that has a gate connected to a gate node, a first electrode, and a second electrode;
    a capacitor that has a first electrode connected to the voltage transfer node, and a second electrode connected to the gate of the driving transistor; and
    an organic light-emitting diode that has an anode and a cathode connected to a second power supply line, and
    wherein the subpixel further comprises:
    a first transistor that has a gate connected to an nth scan line, a first electrode connected to a first data line, and a second electrode connected to the first electrode of the driving transistor;
    a second transistor that has a gate connected to an nth emission control signal line, a first electrode connected to a second electrode of the first transistor, and a second electrode connected to a first power supply line;
    a third transistor that has a gate connected to the nth scan line, a first electrode connected to a second electrode of the driving transistor, and a second electrode connected to the gate of the driving transistor;
    a fourth transistor that has a gate connected to an (n−1)th scan line, a first electrode connected to an initial line, and a second electrode connected to the second electrode of the third transistor and the gate of the driving transistor, where n is an integer equal to or greater than 2;
    a fifth transistor that has a gate connected to the nth emission control signal line, a first electrode connected to the second electrode of the driving transistor, and a second electrode connected to the anode of the organic light-emitting diode;
    a sixth transistor that has a gate connected to the nth scan line, a first electrode connected to the initial line, and a second electrode connected to a second electrode of the fifth transistor; and
    a seventh transistor that has a gate connected to the nth emission control signal line, a first electrode connected to the first power supply line, and a second electrode connected to the voltage transfer node.

2. The electroluminescence display device of claim 1, wherein the display panel comprises a plurality of scan lines, to each of which a plurality of subpixels are connected, and the voltage transfer circuit is provided for each scan line in the non-display area.

3. The electroluminescence display device of claim 2, wherein the voltage transfer circuit comprises at least one voltage transfer transistor that is turned on or off, in response to an (n−1)th scan signal for driving (n−1)th subpixels on an (n−1)th scan line or an nth scan signal for driving nth subpixels on an nth scan line.

4. The electroluminescence display device of claim 3, wherein the voltage transfer circuit comprises:
    a first voltage transfer transistor that has a gate connected to the (n−1)th scan line, a first electrode connected to a reference voltage line for transferring the reference voltage, and a second electrode connected to the voltage transfer node included in the subpixel; and
    a second voltage transfer transistor that has a gate connected to the nth scan line, a first electrode connected to the reference voltage line, and a second electrode connected to the voltage transfer node.

5. The electroluminescence display device of claim 3, wherein the voltage transfer circuit comprises a voltage transfer transistor that has a gate connected to the nth scan line, a first electrode connected to a reference voltage line for transferring the reference voltage, and a second electrode connected to the voltage transfer node.

6. The electroluminescence display device of claim 3, wherein the voltage transfer circuit comprises a voltage transfer transistor that has a gate connected to the (n−1)th scan line, a first electrode connected to a reference voltage line for transferring the reference voltage, and a second electrode connected to the voltage transfer node.

7. The electroluminescence display device of claim 1, wherein the voltage transfer circuit operates to output the reference voltage during an initial period and a sampling period for sampling the threshold voltage of a driving transistor of the subpixel, and
    wherein the reference voltage is a fixed voltage during the initial period and the sampling period.

8. An electroluminescence display device comprising:
    a display panel having a display area where images are displayed and a non-display area where images are not displayed;
    a subpixel located in the display area;
    a gate driver located in the non-display area; and
    a voltage transfer transistor that is in the non-display area and transfers a reference voltage to the subpixel,
    wherein a gate of the voltage transfer transistor is connected to the gate driver,
    wherein the gate driver comprises:
    a pull-up transistor; and
    a first boosting capacitor connected to a gate of the pull-up transistor, and a drain of the pull-up transistor,
    wherein the gate of the voltage transfer transistor is connected to the gate of the pull-up transistor, and
    wherein the subpixel further comprises:
    a first transistor that has a gate connected to an nth scan line, a first electrode connected to a first data line, and a second electrode connected to the first electrode of a driving transistor;
    a second transistor that has a gate connected to an nth emission control signal line, a first electrode connected to a second electrode of the first transistor, and a second electrode connected to a first power supply line;

a third transistor that has a gate connected to the nth scan line, a first electrode connected to a second electrode of the driving transistor, and a second electrode connected to the gate of the driving transistor;

a fourth transistor that has a gate connected to an (n−1)th scan line, a first electrode connected to an initial line, and a second electrode connected to the second electrode of the third transistor and the gate of the driving transistor, where n is an integer equal to or greater than 2;

a fifth transistor that has a gate connected to the nth emission control signal line and a first electrode connected to the second electrode of the driving transistor;

a sixth transistor that has a gate connected to the nth scan line, a first electrode connected to the initial line, and a second electrode connected to a second electrode of the fifth transistor; and a seventh transistor that has a gate connected to the nth emission control signal line, a first electrode connected to the first power supply line, and a second electrode connected to the voltage transfer node.

9. The electroluminescence display device of claim 8, wherein the gate driver further comprises a first auxiliary transistor, and wherein a gate of the first auxiliary transistor is connected to a line via which a logic-low voltage is applied, and a first electrode of the first auxiliary transistor is connected to the gate of the pull-up transistor.

10. The electroluminescence display device of claim 8, wherein a first electrode of the voltage transfer transistor is connected to a line via which the reference voltage is applied, and a second electrode of the voltage transfer transistor is connected to a voltage transfer node included in the subpixel.

11. A driving method of an electroluminescence display device, the electroluminescence display device including a display panel having a display area where images are displayed and a non-display area where images are not displayed; a subpixel located in the display area; and a gate driver and a voltage transfer circuit that are located in the non-display area, wherein the voltage transfer circuit transfers a reference voltage to the subpixel, the method comprising:

initializing the subpixel in an initial period; and compensating for the threshold voltage of a driving transistor of the subpixel in a sampling period, wherein, during the initializing period and the sampling period, the voltage transfer circuit operates in response to a signal applied from outside the display panel or a signal generated on the display panel, wherein the reference voltage is a fixed voltage during the initializing period and the sampling period, and wherein the subpixel further comprises:

a first transistor that has a gate connected to an nth scan line, a first electrode connected to a first data line, and a second electrode connected to the first electrode of the driving transistor;

a second transistor that has a gate connected to an nth emission control signal line, a first electrode connected to a second electrode of the first transistor, and a second electrode connected to a first power supply line;

a third transistor that has a gate connected to the nth scan line, a first electrode connected to a second electrode of the driving transistor, and a second electrode connected to the gate of the driving transistor;

a fourth transistor that has a gate connected to an (n−1)th scan line, a first electrode connected to an initial line, and a second electrode connected to the second electrode of the third transistor and the gate of the driving transistor, where n is an integer equal to or greater than 2;

a fifth transistor that has a gate connected to the nth emission control signal line, a first electrode connected to the second electrode of the driving transistor, and a second electrode connected to the anode of the organic light-emitting diode;

a sixth transistor that has a gate connected to the nth scan line, a first electrode connected to the initial line, and a second electrode connected to a second electrode of the fifth transistor; and a seventh transistor that has a gate connected to the nth emission control signal line, a first electrode connected to the first power supply line, and a second electrode connected to the voltage transfer node.

12. The driving method of claim 11, wherein the voltage transfer circuit is turned on for a first period based on an (n−1)th scan signal for driving (n−1)th subpixels on an (n−1)th scan line, wherein the voltage transfer circuit is turned on during a second period subsequent to the first period based on an nth scan signal for driving nth subpixels on an nth scan line, and wherein the reference voltage is transferred to the nth subpixels during the first and second periods.

13. The driving method of claim 11, wherein, for the subpixels on the display panel, the initializing and the compensating are performed at different times based on an nth scan signal and an (n−1)th scan signal which overlap during at least 1 horizontal time.

14. The driving method of claim 13, wherein the voltage transfer circuit is turned on based on the nth scan signal for driving the nth subpixels to transfer the reference voltage to the nth subpixels.

15. The driving method of claim 11, wherein, for the nth subpixels on the display panel, the initializing and the compensating are performed simultaneously based on an nth scan signal and an (n−1)th scan signal which overlap during at least 1 horizontal time.

16. The driving method of claim 15, wherein the voltage transfer circuit is turned on based on the (n−1)th scan signal for driving the (n−1)th subpixels to transfer the reference voltage to the nth subpixels.

* * * * *